(12) United States Patent
Haratani et al.

(10) Patent No.: US 7,826,254 B2
(45) Date of Patent: Nov. 2, 2010

(54) MAGNETIC STORAGE DEVICE AND METHOD FOR PRODUCING THE SAME

(75) Inventors: Susumu Haratani, Tokyo (JP); Tohru Oikawa, Tokyo (JP); Takashi Asatani, Tokyo (JP)

(73) Assignee: TDK Corporation, Tokyo (JP)

( * ) Notice: Subject to any disclaimer, the term of this patent is extended or adjusted under 35 U.S.C. 154(b) by 626 days.

(21) Appl. No.: 11/810,835

(22) Filed: Jun. 6, 2007

(65) Prior Publication Data

US 2008/0006890 A1   Jan. 10, 2008

(30) Foreign Application Priority Data

Jun. 7, 2006   (JP) ............................. 2006-158142

(51) Int. Cl.
*G11C 11/00* (2006.01)
(52) U.S. Cl. ..................... 365/158; 365/171; 365/173; 257/421
(58) Field of Classification Search ................. 257/421; 365/158, 171, 173
See application file for complete search history.

(56) References Cited

U.S. PATENT DOCUMENTS

| | | | |
|---|---|---|---|
| 6,430,084 B1 * | 8/2002 | Rizzo et al. ................. | 365/173 |
| 6,504,221 B1 * | 1/2003 | Tran et al. ................... | 257/421 |
| 6,921,953 B2 * | 7/2005 | Deak .......................... | 257/421 |
| 7,312,506 B2 * | 12/2007 | Wang et al. ................. | 257/427 |

OTHER PUBLICATIONS

Nikkei Electronics, Nov. 18, 2002, 133(127-138) and partial English translation thereof.
Durlam, et al., "A 1-Mbit MRAM Based on 1T1MTJ Bit Cell Integrated with Copper Interconnects", IEEE J Solid-State Circuits 38, 769 (2003).
Hiromi Niu Fuke, et al., "Spin-valve giant magnetoresistive films with anti ferromagnetic Ir—Mn layers", JAP 81,4004 (1997).
Hoshino et al., "Exchange Coupling between Antiferromagnetic Mn—Ir and Ferromagnetic Ni—Fe Layers", JJAP 35,670 (1996).

* cited by examiner

*Primary Examiner*—Dang T Nguyen
*Assistant Examiner*—Alexander Sofocleous
(74) *Attorney, Agent, or Firm*—Porzio, Bromberg & Newman, P.C.

(57) ABSTRACT

In the magnetic storage device, magnetization characteristics during write cycles are homogenized, and write cycles are carried out efficiently. In the magnetic storage device, the soft magnetic body is formed so as to cover the line either totally or partially, and the anti-ferromagnetic layer is formed on the outer surface of this soft magnetic body. Furthermore, the magneto-resistive element is disposed in the vicinity of the line. Suppose the case where the exchange coupling energy at the interface between the soft magnetic body and the anti-ferromagnetic layer is J (erg/cm$^2$), the saturation magnetization of the soft magnetic body is Ms (emu/cc), and the coercive force of the soft magnetic body is Hc (Oe). Then, the thickness t (cm) of the soft magnetic body is selected to be such that $t<J/(Hc \cdot Ms)$.

14 Claims, 21 Drawing Sheets

(A)

(B)

MAGNETIC STORAGE DEVICE AND METHOD FOR PRODUCING THE SAME

BACKGROUND OF THE INVENTION

1. Field of the Invention

The present invention relates to a magnetic storage device or the like that stores data in magneto-resistive elements.

2. Description of the Related Art

MRAM (Magnetic Random Access Memory) has been receiving much attention recently as a memory device to be used in information processing equipment such as computers, communication equipment, and the like. Since MRAM stores data utilizing magnetism, it is capable of retaining the direction of magnetization without use of any electrical means, and hence, data are not inconveniently lost when power is cut, as is the case with DRAM (Dynamic Random Access Memory) or SRAM (Static RAM), which are generally referred to as volatile memories. Furthermore, when compared with conventional nonvolatile storing means such as flash EEPROM and hard disc drives, MRAM excels in performance in terms of access speed, reliability, power consumption, and the like. Because of these characteristics, it is a common belief that MRAM will be able to simultaneously realize all the advantages of not only volatile memories such as DRAMs and SRAMs but also of nonvolatile memories such as flash EEPROMs and hard disc drives.

Consider, for example, the case of developing information processing equipment that targets so-called ubiquitous computing in which information processing is available regardless of location. A requirement of such ubiquitous computing includes a memory device that must be capable of high speed processing but simultaneously have low power consumption. Such a memory device must also be able to avoid loss of information, even upon power shutdown. MRAM has the potential to meet both of these demands, and is expected to be employed in an increasing number of information processing equipment designs in the future.

In the case of tablets, mobile information terminals, and the like that are carried by a person in day-to-day living, it is often difficult to secure a sufficient power supply. Therefore, in order to be able to process a large amount of information in a very high usage environment, even MRAMs of low power consumption will require a further reduction in power consumption during information processing.

One example of the technology that improves the power consumption rate of an MRAM is a magnetic storage device described as follows. As shown in FIG. 21, this magnetic storage device 500 includes, in each of the storage areas (memory cells), a bit line 502, a word line 504 disposed orthogonal to the bit line 502, and a tunneling magneto-resistive (TMR) element 506 disposed at the intersection between the bit line 502 and the word line 504. Each of the bit line 502 and the word line 506 is capable of creating a magnetic field whose strength is approximately half that necessary to invert the bit state of the TMR element 506. When a current flows through the bit line 502 and the word line 504 that have been selected, the TMR element 506 at the crosspoint inverts its magnetization configuration accordingly.

In this magnetic storage device 500, the bit line 502 and the word line 504 both have a cladding structure where they are coated with a ferromagnetic film 510 which exhibits high magnetic permeability. Therefore, any leak of magnetic flux from the bit line 502 and the word line 504 can be reduced. Furthermore, when the bit line 502 or the word line 504 is energized, the ferromagnetic film 510 becomes magnetized, thereby creating a static magnetic field. Therefore, the sum of this static magnetic field and induced magnetic fields of the bit line 502 and the word line 504 are applied onto the TMR element 506. As a result, even if the power supply is low, the magnetic field that is necessary to invert the magnetization configuration of the TMR element 506 can still be obtained.

Moreover, by coating three surfaces of the bit line 502 and the word line 504, respectively, with the ferromagnetic film 510 but leaving the remaining surface facing the TMR element 506 side open, magnetic flux can be concentrated onto the TMR element 506. This has an advantage in that a write cycle would require less time to be completed.

It should be noted that the TMR element in this instance includes a first magnetic layer (magnetic sensing layer) whose direction of magnetization changes according to an external magnetic field, a second magnetic layer whose direction of magnetization is fixed, and a nonmagnetic insulating layer interposed between the first magnetic layer and the second magnetic layer. This TMR element stores binary data by controlling the orientation of the magnetization directions of the first and second magnetic layers, so that the direction of magnetization is either parallel or antiparallel.

The technology of this magnetic storage device 500 is disclosed by the following documents.

Non-Patent Document 1: Nikkei Electronics, p. 133, Nov. 18, 2002.

Non-Patent Document 2: M. Durlam, et al, "A 1-Mbit MRAM Based on 1T1MTJ Bit Cell Integrated with Copper Interconnects," IEEEJ Solid-State Circuits 38, 769 (2003)

Non-Patent Document 3: Hiromi Niu Fuke, et al, "Spin-valve giant magnetoresistive films with ant ferromagnetic Ir—Mn layers", JAP 81, 4004 (1997)

Non-Patent Document 4: K Hoshino, et al, "Exchange Coupling between Antiferromagnetic Mn—Ir and Ferromagnetic Ni—Fe Layers", JJAP 35, 607 (1996)

According to further research carried out by the inventor of the present invention, however, although the coating of these bit lines 502 and word lines 504 with the ferromagnetic film 510 can reduce the current during write cycles, it is likely that it will make the strength of the resultant magnetic field uneven. In particular, it is difficult to evenly coat the bit line 502 or the word line 504 with the ferromagnetic film 510 along its longitudinal direction. In addition to this, a plurality of domains whose magnetization directions vary widely will be spontaneously formed within the ferromagnetic film 510. These factors may contribute to the possibility that magnetization characteristics acting on respective TMR elements 506 during a write cycle may become uneven.

In addition, when a magnetic field is being inverted by switching the direction of current flowing through the bit line 502 or the word line 504, the presence of the ferromagnetic film 510 causes a problem in that the strength or the rate of change of the magnetic field becomes uneven, depending on which way the current is flowing. As a result, each TMR element 506 experiences an unevenness in write speed, depending on the direction of the current, and it is a concern that control of the current or timing during the write cycle may become complicated.

Furthermore, if many domains are formed within the ferromagnetic film 501, Barkhausen noise is produced when the magnetization configuration of the bit line 502 or the word line 504 changes, and this is also considered to contribute to the deterioration of the write cycle.

SUMMARY OF THE INVENTION

The present invention has been developed in consideration of the above problems, and it is thus an object of the present invention to control the unevenness of a writing magnetic field in a magnetic storage device, and to improve the writing performance thereof.

In order to achieve the above-mentioned objects, a magnetic storage device of the present invention includes: a line that is formed in an arbitrary direction; a soft magnetic body that is formed so as to cover the line either totally or partially; an anti-ferromagnetic layer that is formed on an outer surface of the soft magnetic body; and a magneto-resistive element that is disposed in the vicinity of the line. Then, the magnetic storage device satisfies the equation $t<J/(Hc \cdot Ms)$, where J (erg/cm$^2$) is an exchange coupling energy at a boundary between the soft magnetic body and the anti-ferromagnetic layer, Ms (emu/cc) is a saturation magnetization of the soft magnetic body, Hc (Oe) is a coercive force of the soft magnetic body, and t (cm) is a thickness of the soft magnetic body.

Since the anti-ferromagnetic layer is formed on the outer surface of the soft magnetic body and, at the same time, the thickness of the soft magnetic body t is set to be within a prescribed range, the soft magnetic body can be securely pinned.

To achieve the foregoing object, the magnetic storage device of the present invention is characterized in that the thickness t of the soft magnetic body satisfies the equation $t<J/(Hc_2 \cdot Ms)$ where $Hc_2$ (Oe) is an applied magnetic field necessary for the soft magnetic body to reach 80% of the saturation magnetization Ms. As a result, the reliability of the pinning can further be improved. The coercive force Hc can be considered as the applied magnetic field necessary for the saturation magnetization Ms in the opposing direction to become zero. However, as is the case in the present invention, by setting the thickness t based on the applied magnetic field $Hc_2$ necessary to achieve 80% of the saturation magnetization Ms beyond zero saturation magnetization, the pinning can be achieved more securely.

To achieve the foregoing object, the magnetic storage device of the present invention is characterized in that a direction in which the line extends is almost perpendicular to a direction of easy axis of magnetization of the magneto-resistive element. If the pinning direction is almost perpendicular to the easy axis of magnetization of the magneto-resistive element, it will then be difficult to carry out annealing of the soft magnetic body to be pinned. However, by setting the thickness t of the soft magnetic body to be within a prescribed range as in the present invention, the pinning can be carried out by simply applying a magnetic field.

To achieve the foregoing object, the magnetic storage device of the present invention is characterized by an oxidation prevention cap layer that is provided on an outer circumference side of the anti-ferromagnetic layer. This oxidation prevention cap layer can prevent oxidation of the anti-ferromagnetic layer.

To achieve the foregoing object, the magnetic storage device of the present invention is characterized in that the soft magnetic body has a multi-layer structure which includes a first soft magnetic layer and a second soft magnetic layer, wherein these layers are made of different materials. By selecting appropriate materials, the pinning magnetic field obtained by the anti-ferromagnetic layer can be controlled.

To achieve the foregoing object, the magnetic storage device of the present invention is characterized in that the soft magnetic body includes an element side yoke that is disposed on the magneto-resistive element side of the line and a non-element side yoke that is disposed on the side of the line opposite to the magneto-resistive element, and is configured in an almost annular structure.

A method for producing a magnetic storage device of the present invention that achieves the above-mentioned objectives includes: an element formation step of forming a base material for magneto-resistive elements on a substrate; an element magnetic field application step of annealing a magnetic fixation layer of the base material for the magneto-resistive elements with an element magnetic field being applied in a prescribed direction to form magneto-resistive elements; a line formation step of forming lines almost perpendicular to the direction of the element magnetic field in the vicinity of the magneto-resistive elements; and a magnetic body formation step of forming a soft magnetic body, so as to cover the lines either partially or totally, and an anti-ferromagnetic layer on an outer surface of the soft magnetic body, with a pinning magnetic field formed in the same direction as the lines being applied. The method is also characterized in that a strength of the pinning magnetic field is selected to be greater than a coercive force of the soft magnetic body. With these characteristics, the magnetization configuration of the soft magnetic body can be oriented in the direction of the pinning magnetic field. Further to this, by depositing the anti-ferromagnetic layer thereover, pinning can be securely achieved.

To achieve the foregoing object, the method for producing a magnetic storage device of the present invention is characterized in that, in order to improve the reliability of the orientation of the soft magnetic body, the strength of the pinning magnetic field is selected to be greater than an applied magnetic field necessary for the soft magnetic body to reach 80% of the saturation magnetization Ms.

To achieve the foregoing object, the method for producing a magnetic storage device of the present invention is characterized in that, in the magnetic body formation step, the soft magnetic body and the anti-ferromagnetic layer are formed in a non-annealing environment.

According to the present invention, a magnetic field created by the line can be stabilized, and any change in such a magnetic field can be smoothed, thereby improving write performance.

DETAILED DESCRIPTION OF THE PREFERRED EMBODIMENT

Figure 1:
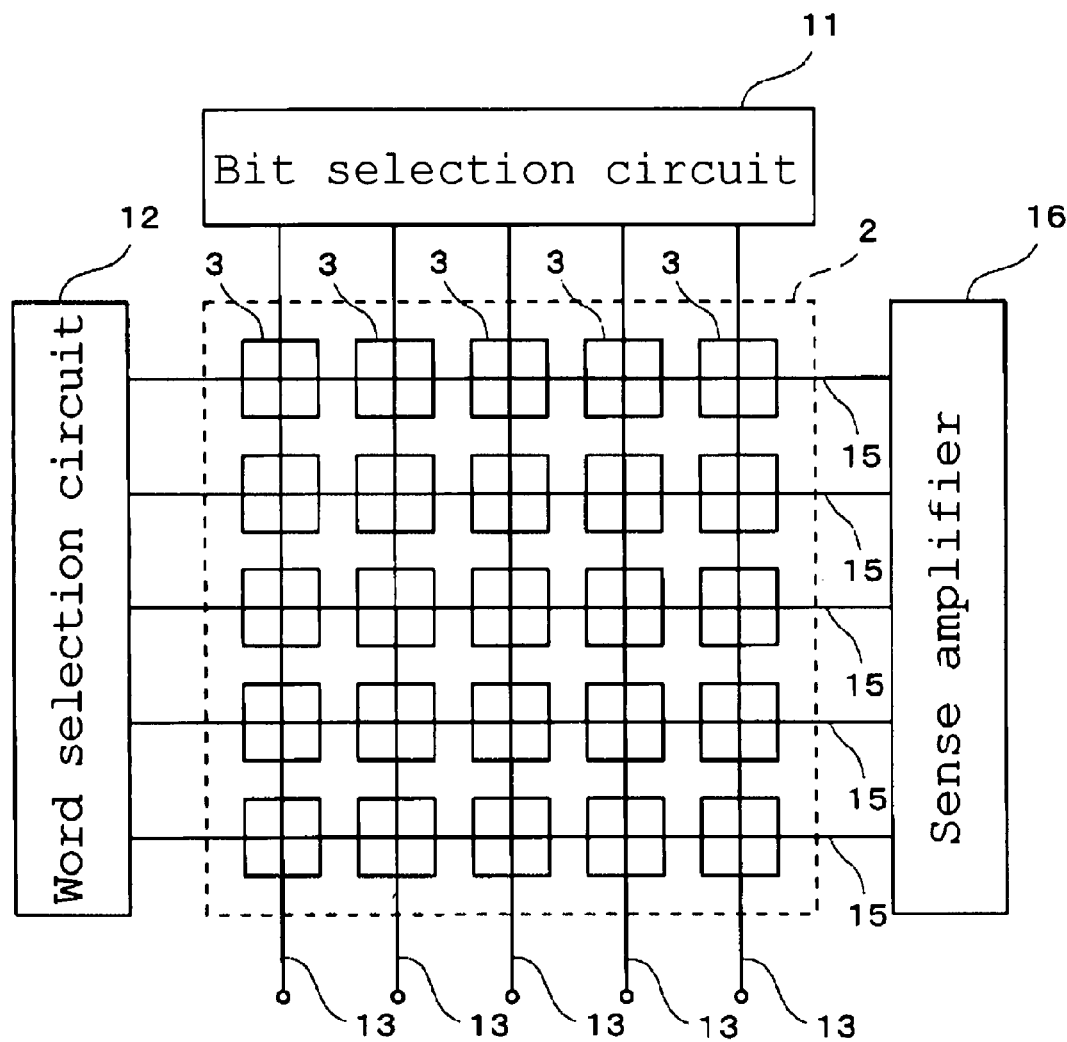
FIG. 1 is a conceptual drawing illustrating a general view of a magnetic storage device according to the first embodiment of the present invention.

In the following paragraphs, various embodiments of the magnetic storage device according to the present invention will be described in detail with reference to the accompanying drawings. In the drawings, the same elements are designated with the same reference numerals, and as such, repetitive explanations therefor are omitted.

FIG. 1 schematically illustrates a general view of a magnetic storage device 1 according to the first embodiment of the present invention. The magnetic storage device 1 includes a memory unit 2, a bit selection circuit 11, a word selection circuit 12, a sense amplifier 16, a plurality of bit lines 13 corresponding to first lines, and a plurality of word lines 15 corresponding to second lines. In the memory unit 2, a plurality of memory cells 3 are disposed in a two-dimensional m×n formation (an array formation), where m and n are integers equal to or greater than 2. The bit lines 13 are arranged parallel to each other in a single plane, and, similarly, the word lines 15 are also arranged parallel to each other in another plane that is a prescribed distance away from the bit lines 13. Since the extending directions of the bit lines 13 and the word lines 15 are perpendicular to each other, they form a grid pattern when viewed together in a general view. Electrical current that flows through the bit line 13 or the word line 15 creates a magnetic field that acts on the TMR element 4 when writing digital data. In this instance, the TMR (tunneling magneto-resistive) element 4 has a property that it changes its electrical resistance when the direction of magnetization is changed. The state of the electrical resistance following these changes determines which binary data is stored in the TMR element 4.

The bit selection circuit 11 is capable of providing the bit line 13 of each memory cell 3 with a write current and a read current, which are either positive or negative. More specifically, the selection circuit 11 includes an address decoder circuit that selects a certain column from the array of memory cells 3 according to an address instructed either internally or externally and a current drive circuit that applies positive or negative voltage to the bit line 13 corresponding to the selected column to produce an electric current, thereby providing the TMR element 4 disposed at the bit line 13 of the selected column with a write magnetic field.

The word selection circuit 12 includes an address decoder circuit that selects a certain row from the array of memory cells 3 according to an address instructed either internally or externally and a current drive circuit that provides the word line 15 corresponding to the selected row with a prescribed voltage. Therefore, by providing an electric current to both the bit line 13 that has been selected by the bit selection circuit 11 and the word line 15 that has been selected by the word selection circuit 12, a magnetic field can be applied to the TMR element 4 that is located at the cross-point of these two lines to write in binary data. Furthermore, the bit selection circuit 11 and the word selection circuit 12 are both capable of controlling a read current through an application of voltage small enough to not initiate a write cycle between the bit line 13 and the word line 15. Specifically, the address decoder circuit of the bit selection circuit 11 selects a column corresponding to an address instructed either internally or externally, and a prescribed voltage is applied to the bit line 13 corresponding to the selected column. In addition to this, at the same time, the address decoder circuit of the word selection circuit 12 selects a row corresponding to the above-mentioned address, and a prescribed voltage is applied to the word line 15 corresponding to the selected row. Consequently, a read current flows through the TMR element 4 that is located at the cross-point of these bit line 13 and word line 15. Then, based on this read current, a change of resistance of the TMR element 4 is detected by the sense amplifier 16 that is connected to the word line 15.

Figure 2:
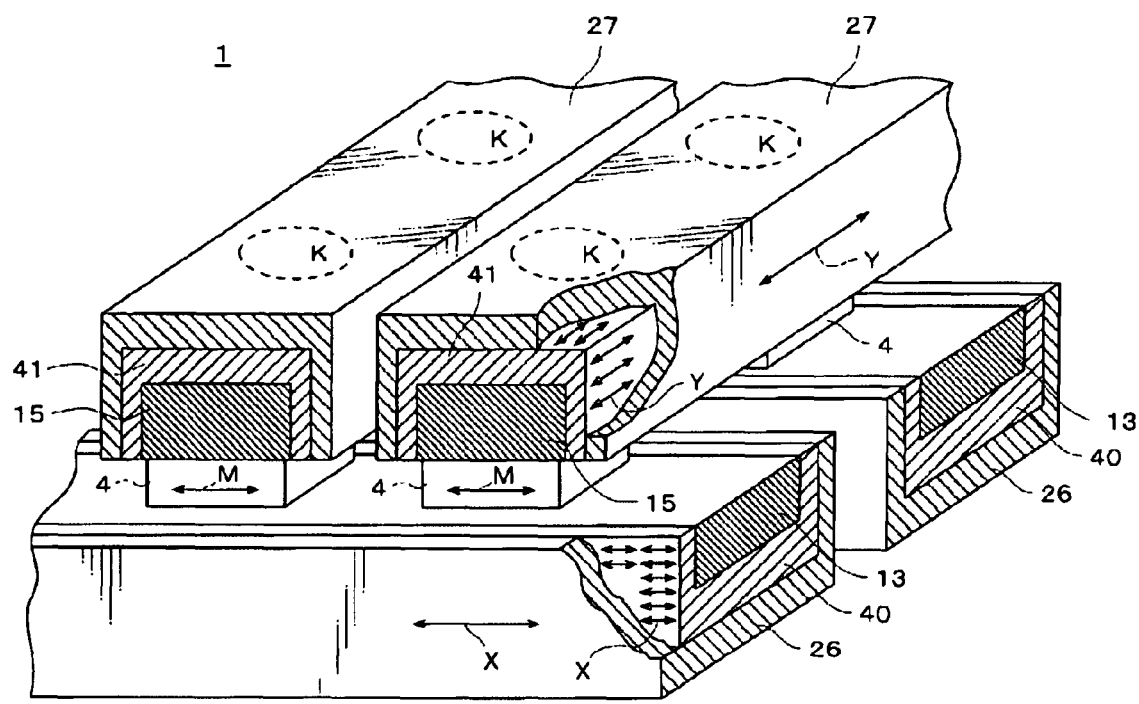
FIG. 2 is a perspective view illustrating a memory cell of the magnetic storage device under magnification.

As shown in FIG. 2 under magnification, the TMR element 4 is disposed where the bit line 13 and the word line 15 cross each other (namely, the cross-point K), or more specifically, it is disposed at this cross-point K so as to beheld between the bit line 13 and the word line 15. Therefore, one side of the TMR element 4 is in contact with the bit line 13 and the other side is in contact with the word line 15. Such an arrangement of TMR elements 4 at the cross-points K that form the nodes of the grid means that, for each bit line 13 or word line 15, there are a plurality of successively disposed TMR elements 4. All other portions except the bit lines 13, the word lines 15, the TMR elements 4, and the like, are electrically insulated. These insulated portions are made of insulating materials such as $SiO_2$ and are similar to insulated regions within a semiconductor layer. Materials such as W, Cu, and Al may be used to form the bit lines 13 or the word lines 15.

Furthermore, the bit line 13 is partially covered with a bit line soft magnetic body 40 in the longitudinal direction, forming a so-called cladding structure. The bit line soft magnetic body 40 is disposed so as to directly cover the side of the bit line 13 which opposes the TMR element 4 (the non-element side) and the two other sides perpendicular thereto, forming a U-shaped cross-section. As a result, this bit line soft magnetic body 40 prevents any leakage of magnetic flux created by the bit line 13.

Similarly, the word line 15 is partially covered with a word line soft magnetic body 41 in the longitudinal direction, forming a so-called cladding structure. The word line soft magnetic body 41 is disposed on the side of the word line 15 directly opposite to the TMR element 4 (the non-element side) and the two other sides perpendicular thereto, forming a U-shaped cross-section. As a result, this word line soft magnetic body 41 prevents any leakage of magnetic flux created by the word line 15. These structures described above ensure that the magnetic flux created by the bit line 13 and the word line 15 is concentrated on the TMR element 4. In this instance, it is preferable that the bit line soft magnetic body 40 and the word line soft magnetic body 41 be made, for example, of NiFe, CoFe, or the like.

A bit line anti-ferromagnetic layer 26 is disposed on the outer surface (opposite side to the bit line 13) of the bit line soft magnetic body 40. Exchange coupling at the joint between the bit line anti-ferromagnetic layer 26 and the bit line soft magnetic body 40 ensures that the magnetization direction of the bit line soft magnetic body 40 is stabilized. In particular, the pinning direction X of magnetization configuration of the bit line soft magnetic body 40 by the bit line anti-ferromagnetic layer 26 is selected to be almost the same as the extending direction of the bit line 13, the cladding of which is provided by the bit line soft magnetic body 40. The bit line anti-ferromagnetic layer 26 is made of an anti-ferromagnetic ordered alloy, an example of which includes materials having a CuAu—I structure. The anti-ferromagnetic ordered alloy has a high blocking temperature and an excellent corrosion-resistant property, but it requires annealing after deposition in order to convert it into an ordered alloy. Specific examples of materials used as an anti-ferromagnetic ordered alloy include NiMn, PtMn, and PdMn, and by applying a magnetic field in an annealing environment, an ordered alloy in the X direction mentioned above, namely, the extending direction of the bit line 13, is achieved.

A word line anti-ferromagnetic layer 27 is disposed on the outer surface (opposite side to the word line 15) of the word line soft magnetic body 41. Exchange coupling at the joint between the word line anti-ferromagnetic layer 27 and the word line soft magnetic body 41 ensures that the magnetization direction of the word line soft magnetic body 41 is stabilized. In particular, the pinning direction Y of the magnetization of the word line soft magnetic body 41 by the word line anti-ferromagnetic layer 27 is selected to be almost the same as the extending direction of the word line 15, the cladding of which is provided by the word line soft magnetic body 41. The word line anti-ferromagnetic layer 27 is made of an anti-ferromagnetic random alloy, an example of which includes materials having an fcc structure. Although the anti-ferromagnetic random alloy has a low blocking temperature, it has a characteristic such that unidirectional anisotropy can be obtained without conducting heat treatment. Specific examples of materials used as an anti-ferromagnetic random alloy include IrMn, RhMn, and FeMn, and by applying a magnetic field along the intended pinning direction Y to be achieved in a non-annealing environment, namely, the extending direction of the word line 15, a ordered alloy can be achieved. As a result, when there is no electric current, the magnetization configuration of the bit line soft magnetic body 40 (or the word line soft magnetic body 41) is made of a single domain and parallel to the direction of the bit line 13 (or the word line 15), the cladding of which is provided by the bit line soft magnetic body 40 (or the word line soft magnetic body 41).

How the thickness t (cm) of the word line soft magnetic body 41 is determined will now be described. Suppose the case where the exchange coupling energy at the boundary between the word line soft magnetic body 41 and the word line anti-ferromagnetic layer 27 is J (erg/cm$^2$), the saturation magnetization of the word line soft magnetic body 41 is Ms (emu/cc), and the coercive force of the word line soft magnetic body 41 is Hc (Oe). In this case, the thickness t of the word line soft magnetic body 41 is selected such that $t<J/(Hc \cdot Ms)$ In particular, in the present embodiment, suppose the case where the externally applied magnetic field necessary for the word line soft magnetic body 41 to reach 80% of the saturation magnetization Ms is $Hc_2$ (Oe). In this case, the thickness t of the word line soft magnetic body 41 is selected such that $t<J/(Mc_2 \cdot Ms)$.

The reasons for these conditions are as follows. In order for the word line anti-ferromagnetic layer 27 to be able to sufficiently pin the word line soft magnetic body 41, it is important that the pinning magnetic field Hua (Oe) acting on the word line soft magnetic body 41 due to the word line anti-ferromagnetic layer 27 is greater than the coercive force Hc of the word line soft magnetic body 41. In this instance, the pinning magnetic field refers to an offset magnetic field where the word line anti-ferromagnetic layer 27 can act on the word line soft magnetic body 41 to provide the pinning effect. In other words, by maintaining the relationship Hua>Hc, unless another magnetic field is externally acted on, the magnetization configuration of the word line soft magnetic body 41 can be at least canceled out by the above-mentioned pinning magnetic field. Conversely, if Hua>Hc is not satisfied, the pinning magnetic field Hua will not be able to sufficiently pin the word line soft magnetic body 41, and it will be hard to obtain a desired effect. Since the magnetic force Hua of the pinning magnetic field can be expressed as $Hua=J/(Ms \cdot t)$, by putting this relation into Hua>Hc, an equation that $J/(Ms \cdot t)>Hc$ can be obtained. On solving this equation for the thickness t of the word line soft magnetic body 41, a relation $t<J/(Hc \cdot Ms)$ is obtained. Hence, by satisfying this equation for t, the word line anti-ferromagnetic layer 27 will be able to effectively pin the word line soft magnetic body 41. If the thickness of the word line soft magnetic body 41 exceeds the above range, then the magnetic force Hua of the pinning magnetic field decreases, and sufficient pinning effect cannot be obtained.

For example, if NiFe is used for the word line soft magnetic body 41 and IrMn is used for the word line anti-ferromagnetic layer 27, then the saturation magnetization Ms and the coercive force Hc of the word line soft magnetic body 41 made of NiFe becomes 780 (emu/cc) and 6 (Oe), respectively, and the exchange coupling energy J of NiFe/IrMn at a boundary between the word line soft magnetic body 41 and the word line anti-ferromagnetic layer 27 becomes 0.061 (erg/cm$^2$). Therefore, substituting these figures into the equation $t<J/(Hc \cdot Ms)$, it will turnout that the thickness t of the word line soft magnetic body 41 needs to be less than 130 nm.

Figure 3:
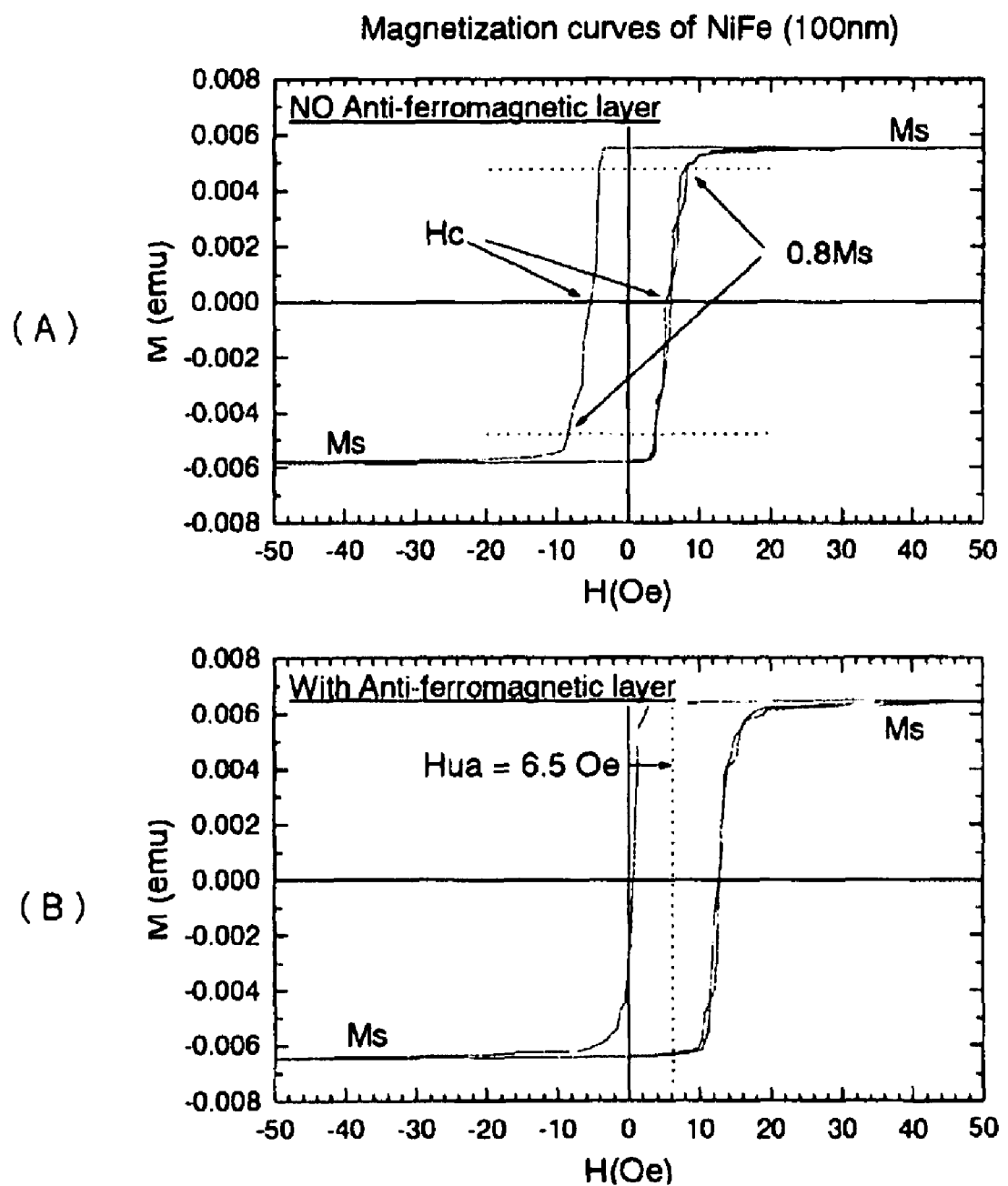
FIGS. 3A and 3B are a graph illustrating magnetization curves of the soft magnetic body (100 nm in thickness) of the magnetic storage device.

FIG. 3A illustrates the magnetization curves of the word line soft magnetic body 41 made of NiFe when it is deposited to a thickness of 100 nm. As can be seen from the figure, the change in strength of magnetization when an external magnetic field H is acted on forms a hysteresis curve with the maximum magnetization in either direction being the saturation magnetization Ms. Therefore, considering the saturation magnetization Ms as a reference, the coercive force Hc, which is approximately 6 (Oe) in this case, is the strength of an external magnetic field required to bring the unidirectional magnetization back to zero and at the saturation magnetization Ms. In other words, if the coercive force Hc is externally applied to the word line soft magnetic body 41, then the magnetization in the opposite direction can at least be canceled (can be brought to zero).

FIG. 3B illustrates magnetization curves when the word line soft magnetic body 41 made of NiFe is pinned by the word line anti-ferromagnetic layer 27. In this instance, the word line anti-ferromagnetic layer 27 is made of IrMn, and its thickness is selected to be 10 nm. As can be seen from the figure, the magnetization curves have been offset due to the pinning effect. The amount of this offset corresponds to the pinning magnetic field Hua (Oe) by the word line anti-ferromagnetic layer 27. In this instance, since the thickness of the word line soft magnetic body 41 is selected to be 100 nm and, at the same time, IrMn is used to form the word line anti-ferromagnetic layer 27, the pinning magnetic field becomes Hua=6.5 (Oe). Consequently, since Hua is greater than Hc (=6 (Oe)), the magnetization configuration of roughly the whole word line soft magnetic body 41 can be oriented toward the pinning magnetic field Hua side.

Furthermore, in the present invention, it is preferable that the magnetic force Hua (Oe) of the pinning magnetic field formed by the word line anti-ferromagnetic layer 27 be larger than an externally applied magnetic field $Hc_2$ (Oe) at the word line soft magnetic body 41. In this instance, this externally applied magnetic field $Hc_2$ can be defined as an external magnetic field that can be induced up to approximately 80% of the saturation magnetization Ms of the word line soft magnetic body 41. The reason for this is that, if this externally applied magnetic field $Hc_2$ is exceeded by the magnetic force of the pinning magnetic field, the magnetization configuration of the word line soft magnetic body 41 can be made of a single domain more securely.

For example, an externally applied magnetic field $Hc_2$ necessary for the word line soft magnetic body 41 made of NiFe to reach approximately 625 (emu/cc), which is 80% of the saturation magnetization Ms, is 8 (Oe). If this value is put in the equation $t<J/(Mc \cdot Ms)$, then it turns out that the thickness t of the word line soft magnetic body 41 should preferably be selected to be less than 93 nm.

Figure 4:
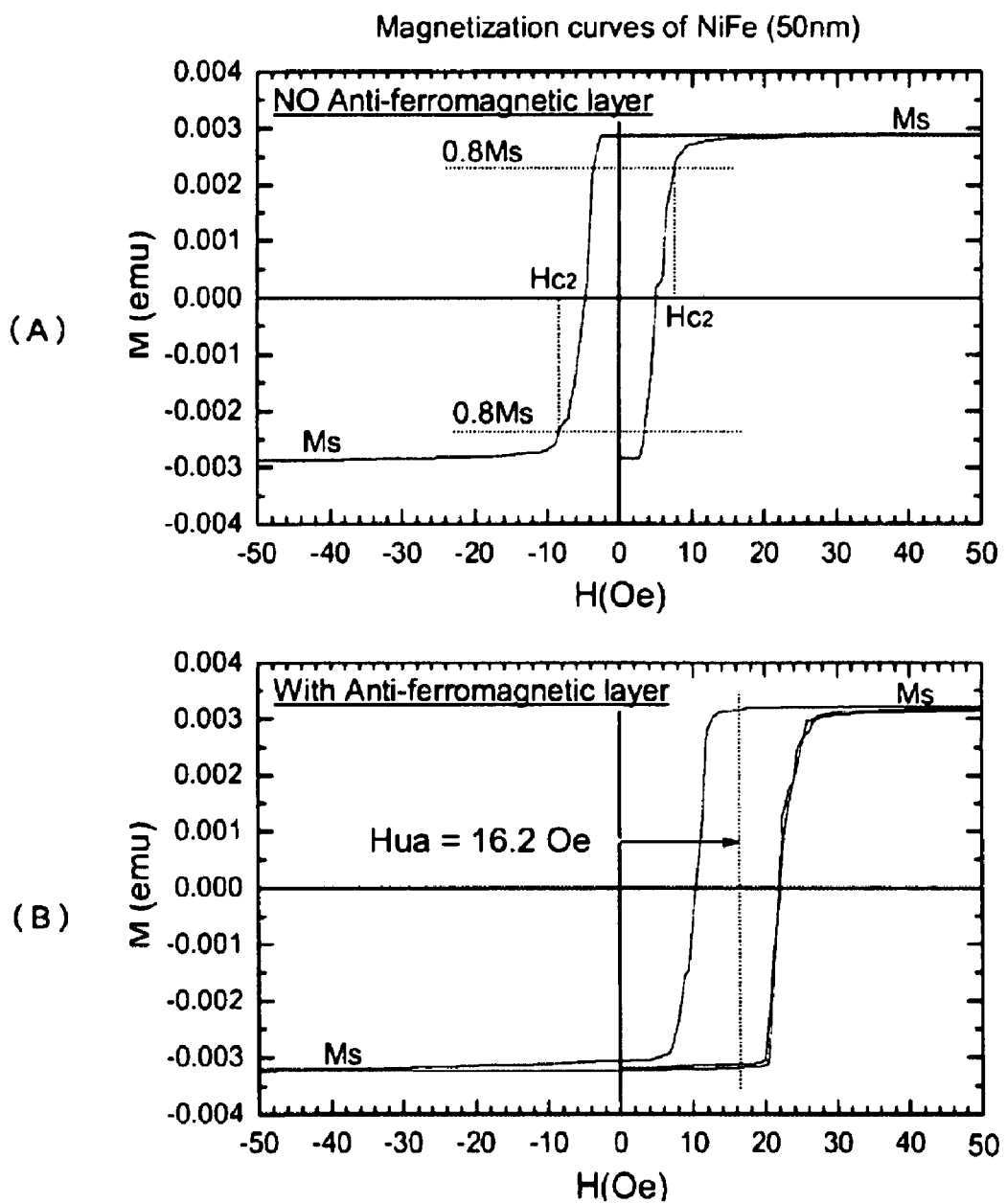
FIGS. 4A and 4B are a graph illustrating magnetization curves of the soft magnetic body (50 nm in thickness) of the magnetic storage device.

FIG. 4A illustrates the magnetization curves of the word line soft magnetic body 41 made of NiFe when it is deposited to a thickness of 50 nm. As can be seen from the figure, the change in strength of magnetization when an external magnetic field H is acted on forms a hysteresis curve with the maximum magnetization in either direction being the saturation magnetization Ms. Therefore, the above-mentioned externally applied magnetic field $Hc_2$ can be considered as a magnetic field that can induce the saturation magnetization Ms in one direction to be approximately 80% of the saturation magnetization Ms in the opposite direction. Therefore, if the above-mentioned externally applied magnetic field $Hc_2$ is exceeded by the magnetic force Hua of the pinning magnetic field by the word line anti-ferromagnetic layer 27, then the magnetization configuration of the word line soft magnetic body 41 is entirely oriented in the direction of the pinning magnetic field. In other words, by allowing a pinning magnetic field that exceeds the externally applied magnetic field $Hc_2$ to act on the word line soft magnetic body 41, the magnetization configuration can be securely oriented.

FIG. 4B illustrates the magnetization curves when the word line soft magnetic body 41 made of NiFe is pinned by the word line anti-ferromagnetic layer 27. In this instance, the word line anti-ferromagnetic layer 27 is made of IrMn, and its thickness is selected to be 10 nm. As can be seen from the figure, the magnetization curve has been offset due to the pinning effect, and the amount of this offset corresponds to the pinning magnetic field Hua (Oe) formed by the word line anti-ferromagnetic layer 27. In this instance, since the thickness of the word line soft magnetic body 41 is selected to be 50 nm and, at the same time, IrMn is used to form the word line anti-ferromagnetic layer 27, the pinning magnetic field becomes Hua=16.2 (Oe). As a result, since Hua is much larger than Hc, it turns out that the magnetization configuration of roughly the whole word line soft magnetic body 41 is oriented along the pinning magnetic field Hua more securely, compared to the above-mentioned FIGS. 3A and 3B.

Figure 5:
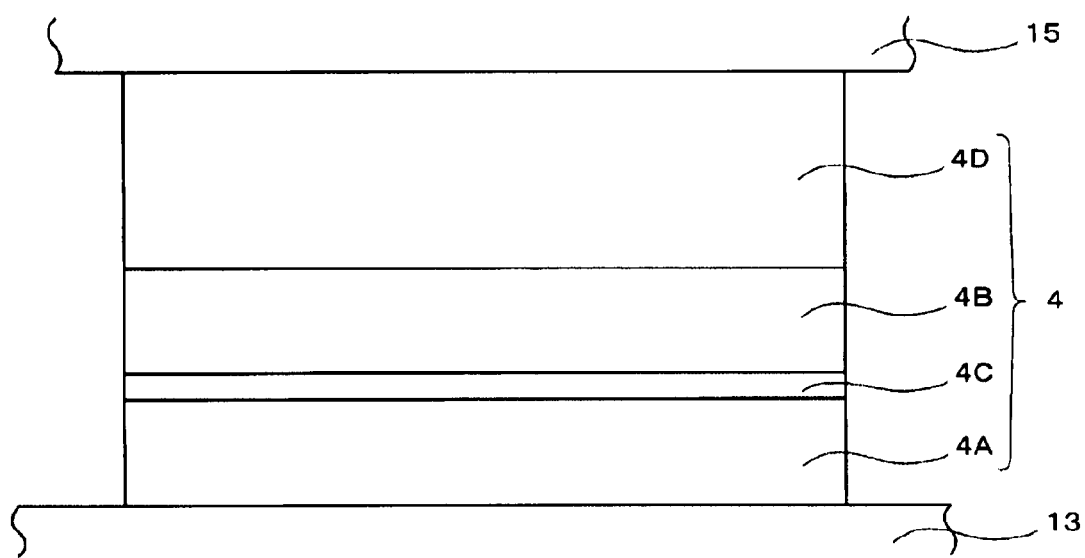
FIG. 5 is a side view illustrating under magnification the layered structure of a magneto-resistive element to be disposed in the magnetic storage device.

FIG. 5 illustrates the TMR element 4 under magnification. This TMR element 4 includes a first magnetic layer (free layer/magnetic sensing layer) 4A whose direction of magnetization changes according to an external magnetic field, a second magnetic layer (pinned layer) 4B whose direction of magnetization is fixed, a nonmagnetic insulating layer (insulating layer) 4C interposed between the first magnetic layer 4A and the second magnetic layer 4B, and an anti-ferromagnetic layer 4D that fixes (or pins) the direction of magnetization of the second magnetic layer 4B. In this TMR element 4, when it is acted on by an external magnetic field and the magnetization direction of the first magnetic layer 4A changes, the value of the resistance between the first magnetic layer 4A and the second magnetic layer 4B changes. Consequently, by utilizing this change in the value of the resistance, binary data can be recorded. Examples of materials used to form the first magnetic layer 4A include Co, CoFe, NiFe, NiFeCo, and CoPt.

The magnetization direction of the second magnetic layer 4B is fixed by the anti-ferromagnetic layer 4D. In other words, due to the exchange coupling at the joint between the anti-ferromagnetic layer 4D and the second magnetic layer 4B, the magnetization direction of the second magnetic layer 4B is stabilized and oriented in one direction. The direction of the easy axis of magnetization of the second magnetic layer 4B is selected to be along the direction of the easy axis of magnetization of the first magnetic layer 4A. Ferromagnetic materials such as Co, CoFe, NiFe, NiFeCo, CoPt, and the like can be used to form the second magnetic layer 4B. Furthermore, the anti-ferromagnetic layer 4D can be made of IrMn, PtMn, FeMn, PtPdMn, NiO, or any combination of these materials.

The nonmagnetic insulating layer 4C is made of materials that are nonmagnetic and have insulating properties, and is interposed between the first magnetic layer 4A and the second magnetic layer 4B, forming a structure where the tunneling magneto-resistive effect can manifest itself. More specifically, the nonmagnetic insulating layer 4C has different values of electrical resistance, depending on the relative orientation (parallel or antiparallel) of the magnetization directions of the first magnetic layer 4A and the second magnetic layer 4B. The nonmagnetic insulating layer 4C is preferably made of oxides or nitrides of metals such as Al, Zn, and Mg.

Although, in the present embodiment, the second magnetic layer 4B is made of a single layer and its direction of magnetization is fixed by the anti-ferromagnetic layer 4D, the present invention is not limited to such a structure. For example, although the illustration is omitted here, instead of this second magnetic layer, a layer having a synthetic structure made of three layers may be used, where the direction of magnetization of this synthetic structure is fixed by the anti-ferromagnetic layer 4D. This synthetic structure may be made of one nonmagnetic layer disposed between two magnetic layers composed of a first magnetic layer side magnetic layer and an anti-ferromagnetic layer side magnetic layer. The magnetization directions of these two magnetic layers are selected to be always antiparallel. Therefore, by using the anti-ferromagnetic layer 4D and fixing the magnetization direction of the anti-ferromagnetic layer side magnetic layer, the magnetization direction of the first magnetic layer side magnetic layer will be indirectly fixed to be antiparallel. Although there is no specific limitation to materials used to form the anti-ferromagnetic layer side magnetic layer of the synthetic structure, it is preferable that ferromagnetic materials such as Co, CoFe, NiFe, NiFeCo, CoPt, or the like be used alone or in combination. Furthermore, the nonmagnetic metal layer provided within the synthetic structure is preferably made of Ru, Rh, Ir, Cu, Ag, or the like. It is preferable that the thickness of the nonmagnetic metal layer be 2 nm or less because of a requirement that a strong exchange coupling be achieved with the magnetic layers that hold the nonmagnetic metal layer therebetween.

The anti-ferromagnetic layer 4D of the TMR element 4 is electrically connected to the word line 15. The first magnetic layer 4A of the TMR element 4 is electrically connected to the bit line 13. Because of this structure, a read current can flow from the bit line 13 to the word line 15 through the TMR element 4, and the change in electrical resistance of the TMR element 4 can be detected by the sense amplifier 16. The easy axis of magnetization of the first magnetic layer 4A of the TMR element 4 is selected to be parallel to the longitudinal direction (extending direction) of the bit line 13.

Returning to FIG. 2, in the TMR element 4 disposed at the cross-point K, the direction of magnetization fixation M of the second magnetic layer 4B by the anti-ferromagnetic layer 4D is parallel to the extending direction X of the bit line 13 that is formed in advance, before the TMR element 4 is formed. In other words, because of the exchange coupling at the joint between the anti-ferromagnetic layer 4D and the second magnetic layer 4B, the magnetization direction M of the second magnetic layer 4B is oriented and stabilized along the extending direction X of the bit line 13. The direction of easy axis of magnetization of the first magnetic layer 4A is also selected to be in the extending direction of the bit line 13. As a result, the pinning direction M of the second magnetic layer 4B of the TMR element 4 and the pinning direction X of the bit line soft magnetic body 40 become parallel to each other, and the pinning direction M of the second magnetic layer 4B and the pinning direction Y of the word line soft magnetic body 41 become perpendicular to each other.

A write cycle of this magnetic storage device 1 takes the following steps. First, based on the address requested, one bit line is selected from a plurality of bit lines 13, and, based on the same address, one word line is selected from a plurality of word lines 15. Then, which binary data (0 or 1) is to be written is determined, and a current based on this binary data is provided. As a result, circumferential magnetic fields are produced along the bit line 13 and the word line 15, and because of these magnetic fields, magnetization directions X and Y of the bit line soft magnetic body 40 and the word line soft magnetic body 41, respectively, are induced to make a smooth rotation and match the circumferential magnetic fields of the bit line 13 and the word line 15, respectively. According to the cooperative effect of these magnetic fields of the bit line 13 and the word line 15, the magnetization configuration of the first magnetic layer (not shown in the figure) of the TMR element 4 is selected to be in a designated direction, thereby completing the write cycle of the binary data.

In this magnetic storage device 1, the magnetization configurations X and Y of the bit line soft magnetic body 40 and the word line soft magnetic body 41, respectively, that are intended to prevent any leakage of magnetic flux are pinned in the extending directions of the bit line 13 and the word line 15, respectively, to obtain a single domain. Therefore, the magnetization configuration when there is no current is neutral, and, moreover, the change of an induced magnetic field produced by the current is smooth so that the amount of write noise is reduced. Furthermore, with regard to the cladding structure employed for the bit line 13 and the word line 15, if the characteristics of a plurality of TMR elements 4 that are disposed in the vicinity of the bit line 13 and the word line 15 (at the cross-point K) differ, the timing control during the write cycle or control of the current/voltage becomes complicated. However, in the magnetic storage device 1, while retaining the cladding structure for the bit line 13 and the word line 15, the magnetization configurations of the bit line soft magnetic body 40 and the word line soft magnetic body 41 are homogenized along the entire longitudinal extensions by the bit line anti-ferromagnetic layer 26 and the word line anti-ferromagnetic layer 27, respectively. Therefore, any variations in characteristics are reduced, and the write precision can be improved accordingly.

In the magnetic storage device 1, since an anti-ferromagnetic ordered alloy is used to form the bit line anti-ferromagnetic layer 26, the pinning can be accomplished by the application of a magnetic field and the annealing. Conversely, since an anti-ferromagnetic random alloy is used to form the word line anti-ferromagnetic layer 27, pinning can be accomplished by the application of a magnetic field in a non-annealing environment. Since the easy axis of magnetization of the TMR element 4 to be disposed after the formation of the bit line 13 is matched with the pinning direction of the bit line anti-ferromagnetic layer 26, a change in the pinning configuration of the bit line anti-ferromagnetic layer 26 can be avoided when the TMR element 4 is subjected to the application of a magnetic field and annealing.

Furthermore, since, in the magnetic storage device 1, the thickness t of the word line soft magnetic body 41 is selected to satisfy the equation t<J/(Hc·Ms), or preferably t<J/(Hc$_2$·Ms), the pinning by the word line anti-ferromagnetic layer 27 can be securely realized. As will be described later, in the case where the word line soft magnetic body 41 and the word line anti-ferromagnetic layer 27 are disposed after the formation of the TMR element 4, and, moreover, the pinning direction by the word line anti-ferromagnetic layer 27 is perpendicular to the pinning direction of the TMR element 4, it is difficult to conduct annealing while depositing the word line anti-ferromagnetic layer 27. However, if the thickness of the word line soft magnetic body 41 is selected as mentioned above, then, even if it is in the non-annealing condition, the pinning can be securely accomplished by applying a magnetic field.

Consequently, in the magnetic storage device 1, both the bit line soft magnetic body 40 and the word line soft magnetic body 41 can be pinned in the directions of the bit line 13 and the word line 15, respectively, while the stability of the magnetization configuration of the TMR element 4 is being maintained.

A method for producing the magnetic storage device 1 will now be described.

Figure 6:
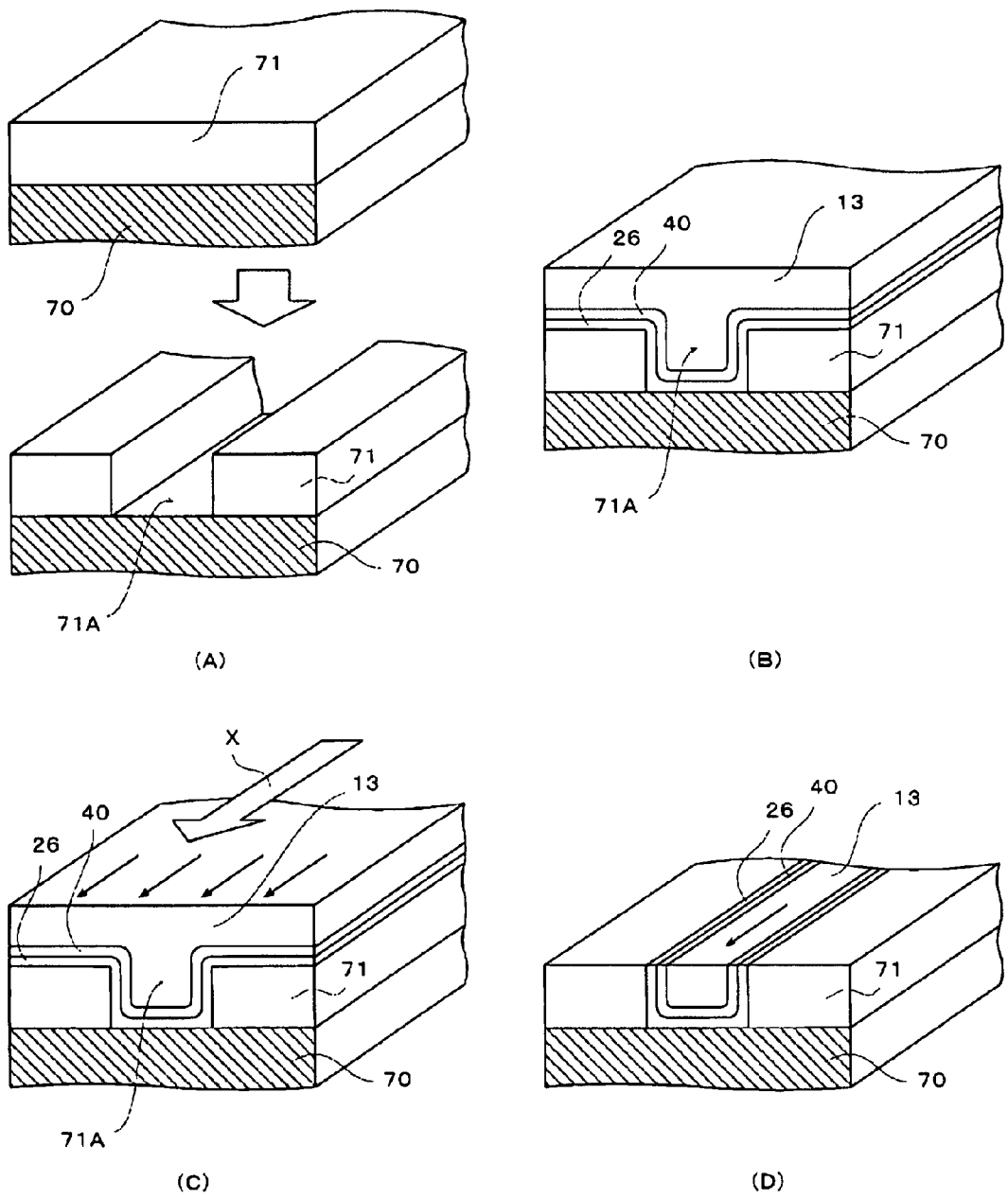
FIGS. 6A to 6D are process diagrams illustrating production steps for the magnetic storage device.

First, as shown in FIG. 6A, patterning to match the bit line 13 is conducted on a substrate 70 on which an insulating layer 71 made of material mainly consisting of SiO$_2$ is formed, and then a groove 71A for the bit line 13 is formed in the insulating layer 71 using reactive ion etching (RIE). Next, as shown in FIG. 6B, base materials for the bit line anti-ferromagnetic layer 26, the bit line soft magnetic body 40, and the bit line 13 are deposited in this order over on a region which includes the groove 71A. In this instance, an anti-ferromagnetic ordered alloy that has a high blocking temperature is used as the base material used to form the bit line anti-ferromagnetic layer 26. Then, as shown in FIG. 6C, this layered structure is subjected to annealing within a magnetic field. The direction X of this magnetic field is taken to match the extending direction of the groove 71A, namely, the extending direction of the bit line 13 to be created. As a result, the bit line soft magnetic body 40 is pinned by the bit line anti-ferromagnetic layer 26. Next, as shown in FIG. 6D, part of the base materials for the bit line anti-ferromagnetic layer 26, the bit line soft magnetic body 40, and the bit line 13 that are covering regions other than the groove 71A is removed using chemical-mechanical polishing (CMP) to obtain a smooth surface. Consequently, the bit line 13 that has a pinned cladding structure (bit line soft magnetic body 40) is formed in the groove 71A. In this instance, it is also preferable that the thickness t of the bit line soft magnetic body 40 satisfy the equation $t<J/(Hc \cdot Ms)$, or more preferably $t<J/(Hc_2 \cdot Ms)$.

Figure 7:
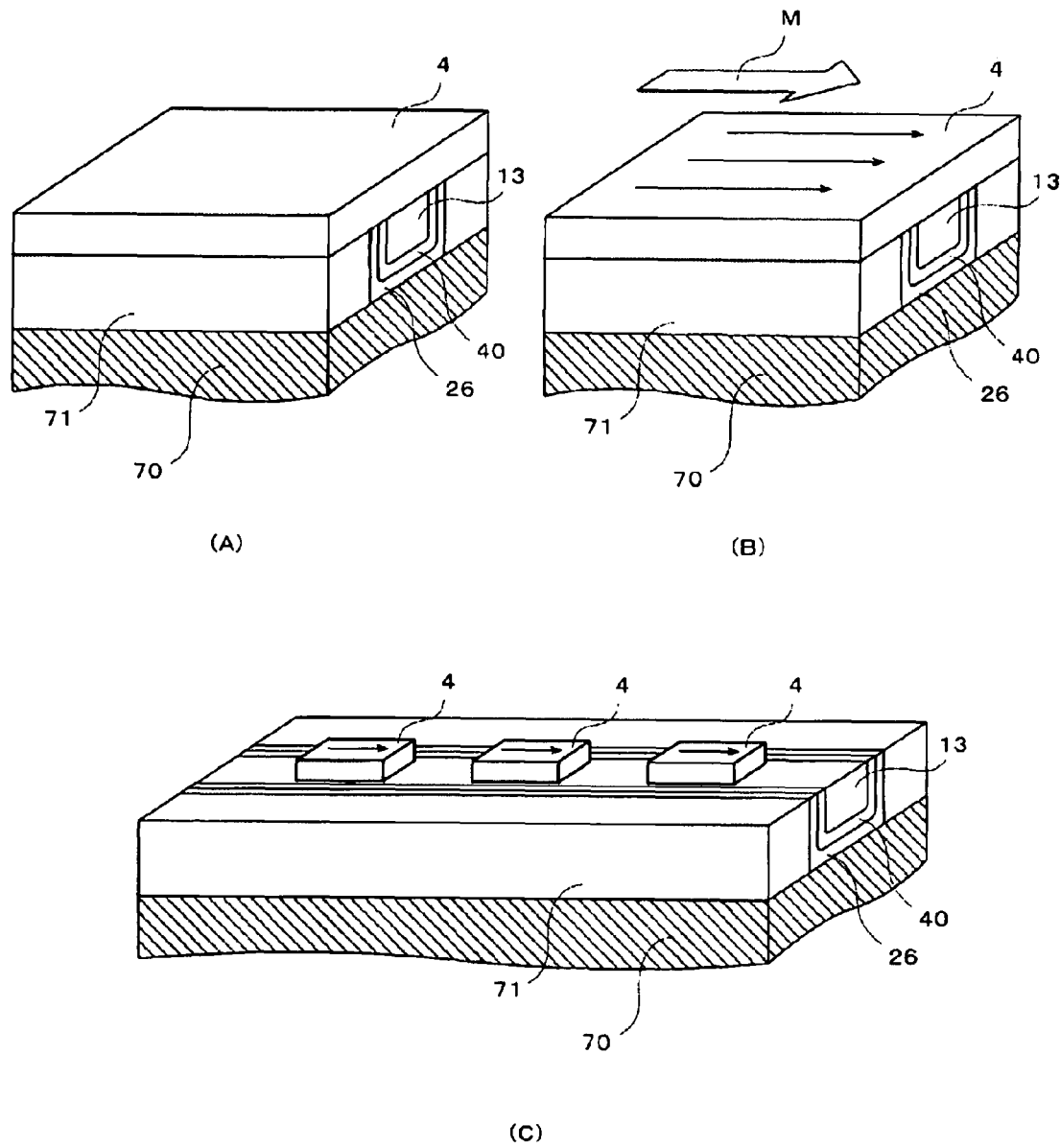
FIGS. 7A to 7C are process diagrams illustrating production steps for the magnetic storage device.

Next, as shown in FIG. 7A, a base material for the TMR elements 4 is deposited. Specifically, base materials for the first magnetic layer 4A, the nonmagnetic insulating layer (insulating layer) 4C, the second magnetic layer (pinned layer) 4B, and the anti-ferromagnetic layer 4D are deposited in this order. In this instance, too, an anti-ferromagnetic ordered alloy that has a high blocking temperature is used for the anti-ferromagnetic layer 4D. After the deposition of these base materials, as shown in FIG. 6B, this layered structure is subjected to annealing within a magnetic field so that the magnetization configuration of the anti-ferromagnetic layer 4D becomes unidirectionally anisotropic and remains as such. The direction M of the magnetic field to be applied is selected to be parallel to the extending direction X of the bit line 13, namely, the direction X of the magnetic field shown in FIG. 6C, and this step ensures that the magnetization direction M of the second magnetic layer 4B will be pinned along the extending direction of the bit line 13.

Then, by patterning to define regions corresponding to the TMR elements 4, unwanted portions are removed, and, then, through refilling, the TMR elements 4 are formed. As mentioned previously, the direction of the easy axis of magnetization of this TMR element 4 and the pinning direction of the second magnetic layer 4B concur with the extending direction of the bit line 13.

Figure 8:
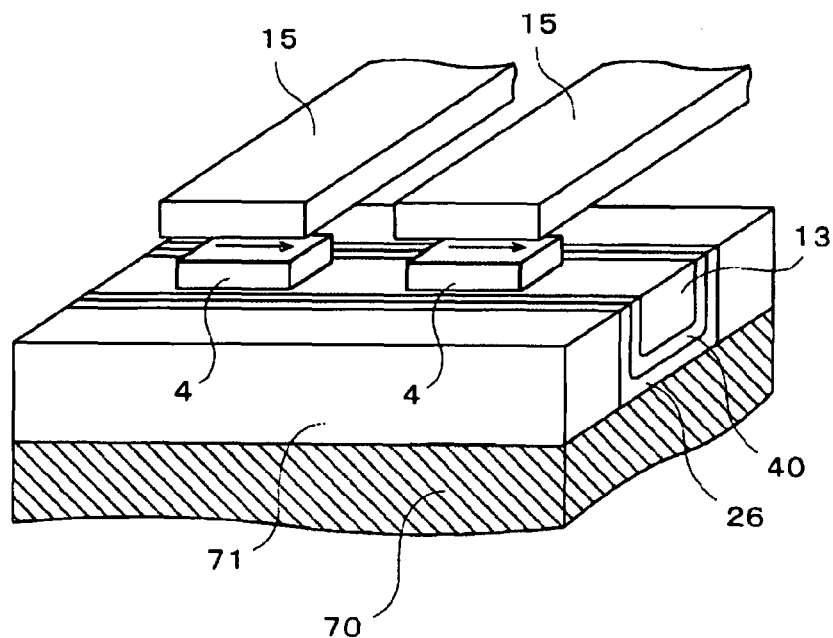
FIGS. 8A and 8B are process diagrams illustrating production steps for the magnetic storage device.
Figure 8:
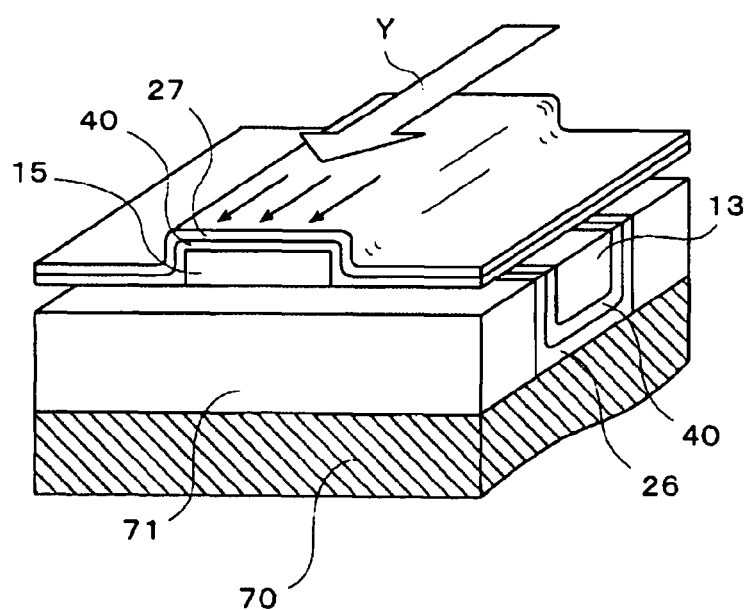

Then, as shown in FIG. 8A, the word line 15 is formed by a liftoff process or a plating process, and, then, base materials for the word line soft magnetic layer 41 and the word line anti-ferromagnetic layer 27 are collectively deposited in this order so as to cover the word line 15 (see FIG. 8B). As this is being done, the thickness t of the word line soft magnetic body 41 is adjusted to become $t<J/(Hc \cdot Ms)$, or preferably $t<J/(Hc_2 \cdot Ms)$, as already mentioned.

Furthermore, when depositing the word line soft magnetic body 41 and the anti-ferromagnetic layer 27, a magnetic field for pinning in a non-annealing environment is applied. The direction Y of this pinning magnetic field is selected to be parallel to the extending direction of the word line 15, and its strength is set to be greater than the coercive force Hc of the word line soft magnetic body 41. More preferably, the strength of the pinning magnetic field is set to be greater than an applied magnetic field $Hc_2$ necessary for the word line soft magnetic body 41 to reach 80% of the saturation magnetization Ms.

As a result, the pinning magnetic field exceeds the coercive force Hc of the word line soft magnetic body 41 when the deposition of the word line soft magnetic body 41 is finished, and, therefore, the magnetization configuration of the word line soft magnetic body 41 is oriented along the pinning magnetic field and forms a single domain configuration. In particular, by selecting the strength of the pinning magnetic field to be greater than the above-mentioned applied magnetic field $Hc_2$, the word line soft magnetic body 41 can be more securely oriented. Since the word line anti-ferromagnetic layer 27 can be deposited onto the word line soft magnetic body 41 that is in the oriented configuration, pinning can be securely achieved. For example, in the case where NiFe is used to form the word line soft magnetic body 41, the strength of the pinning magnetic field is selected to be greater than the coercive force Hc=6 (Oe), or more preferably, greater than the above-mentioned applied magnetic field $Hc_2$=8 (Oe).

As a result, the magnetization configuration of the word line soft magnetic body 41 is securely pinned in the direction Y. Then, unwanted portions of the word line soft magnetic body 41 and the word line anti-ferromagnetic layer 27 are removed, and the magnetic storage device 1 illustrated in FIG. 2 is obtained.

According to the present production method, since the pinning direction of magnetization of the bit line soft magnetic body 40 and that of the TMR element 4 are made to concur each other, the annealing of the TMR element 4 acts to further strengthen the pinning action of the bit line soft magnetic body 40. In other words, although the bit line anti-ferromagnetic layer 26 is annealed when the TMR element 4 is annealed, since the pinning directions are the same, it is possible to maintain the pinning configuration of the bit line anti-ferromagnetic layer 26. Furthermore, since the thickness t of the word line soft magnetic body 41 as well as the strength of the pinning magnetic field are chosen to be within a prescribed range, the word line soft magnetic body 41 can be pinned simply by applying a magnetic field in a non-annealing environment, thereby avoiding adverse effects upon the magnetization configuration of the anti-ferromagnetic layer 4D having a high blocking temperature or the bit line anti-ferromagnetic layer 26. Therefore, the magnetic storage device 1 in which a stable magnetization configuration is achieved in all of the bit line soft magnetic body 40, the word line soft magnetic body 41, and the TMR element 4 can be produced.

Figure 9:
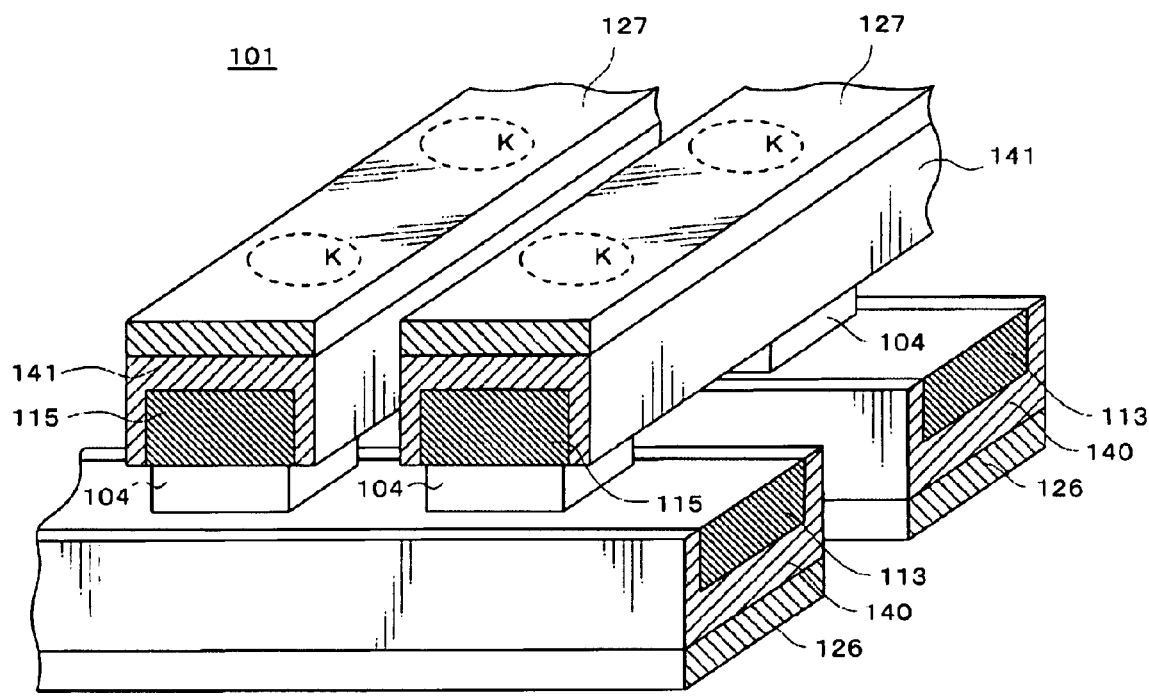
FIG. 9 is a perspective view illustrating under magnification the structure of a magnetic storage device according to the second embodiment of the present invention.

A magnetic storage device 101 according to the second embodiment of the present invention will now be described with reference to FIG. 9. In the following description, the same or similar components as those appeared in the magnetic storage device 1 of the first embodiment will be designated with reference numerals whose last two digits are the same as in the first embodiment, and their descriptions will be omitted. Different parts will be mainly described.

In the magnetic storage device 101, the bit line 113 and the word line 115 are provided with the bit line soft magnetic body 140 and the word line soft magnetic body 141, respectively, each having a U-shaped cross-section and surrounding the bit line 113 or the word line 115, and only the non-element sides of the bit line 113 and the word line 115 are covered with the bit line anti-ferromagnetic layer 126 and the word line anti-ferromagnetic layer 127, respectively. The thickness t of the word line soft magnetic body 141 satisfies the equation $t<J/(Mc \cdot Ms)$ as in the first embodiment. According to this magnetic storage device 101, it is possible that magnetization configurations of the bit line soft magnetic body 140 and the word line soft magnetic body 141 are securely pinned in the longitudinal directions of the bit line 113 and the word line 115, respectively. As a result, in the present magnetic storage device 101, too, the change in a write cycle magnetic field created by the bit line 113 and the word line 115 becomes smoothened, and variations of the magnetic field during the write cycle can be reduced.

Figure 10:
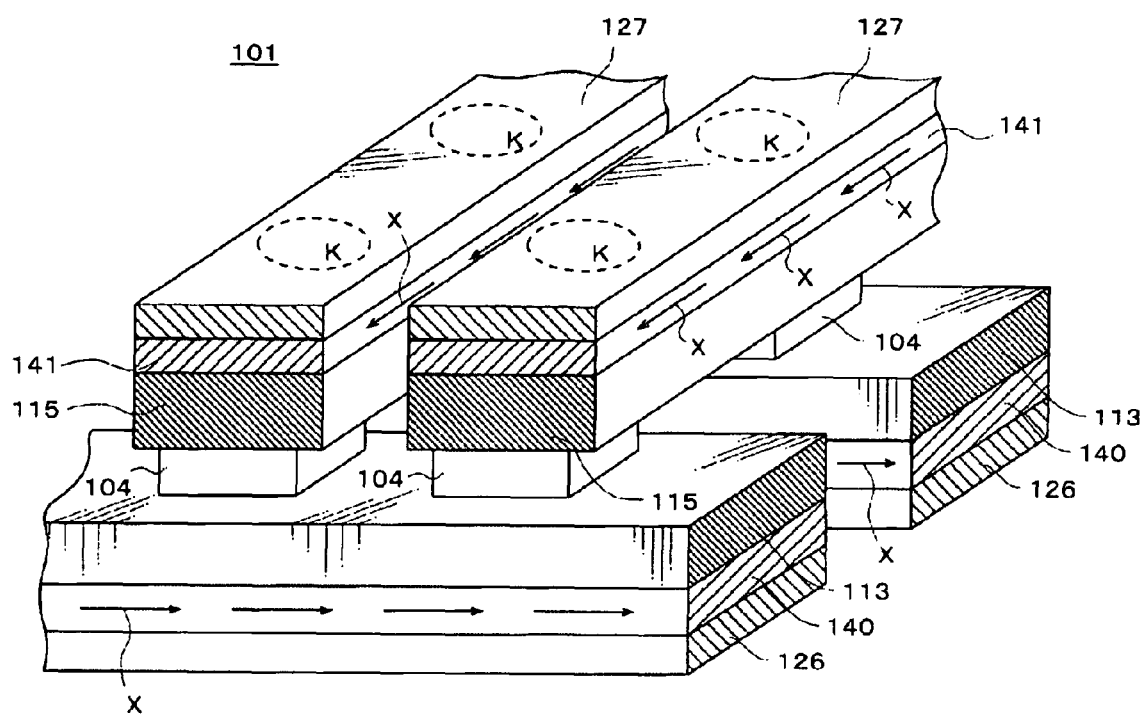
FIG. 10 is a perspective view illustrating under magnification the structure of a magnetic storage device according to another example of the second embodiment of the present invention.

Although, in this magnetic storage device 101, both the bit line soft magnetic body 140 and the word line soft magnetic body 141 have a U-shaped cross-section, the present invention is not limited to such a structure. For example, as illustrated in FIG. 10, only the non-element sides of the bit line 113 and the word line 115 may be covered with the bit line soft magnetic body 140 and the word line soft magnetic body 141, respectively, such that their cross-sections do not become U-shaped. Such an arrangement can also prevent any leakage of magnetic flux from the lines 113 and 115.

As mentioned so far, in the present embodiment, the bit line 113 and the word line 115 have cladding structure along the entire extension in the longitudinal direction. However, the present invention is not limited to such a structure, and the cladding structure may be provided partially in the longitudinal direction thereof. Although the details will be described later, from the standpoint of improving the strength of the magnetic field to the TMR element, partial cladding over portions including at least the cross-point K of the bit line and the word line, which may be referred to as the yoke structure, may be available.

Furthermore, although the above embodiment illustrates an example where the TMR element makes direct contact with the bit line and the word line, the present invention is not limited to such an arrangement. For example, the TMR element may be disposed with some gaps to the bit line and the word line, and electrodes that make contact with the TMR element (read-only electrode) may be separately provided in those gaps.

Figure 11:
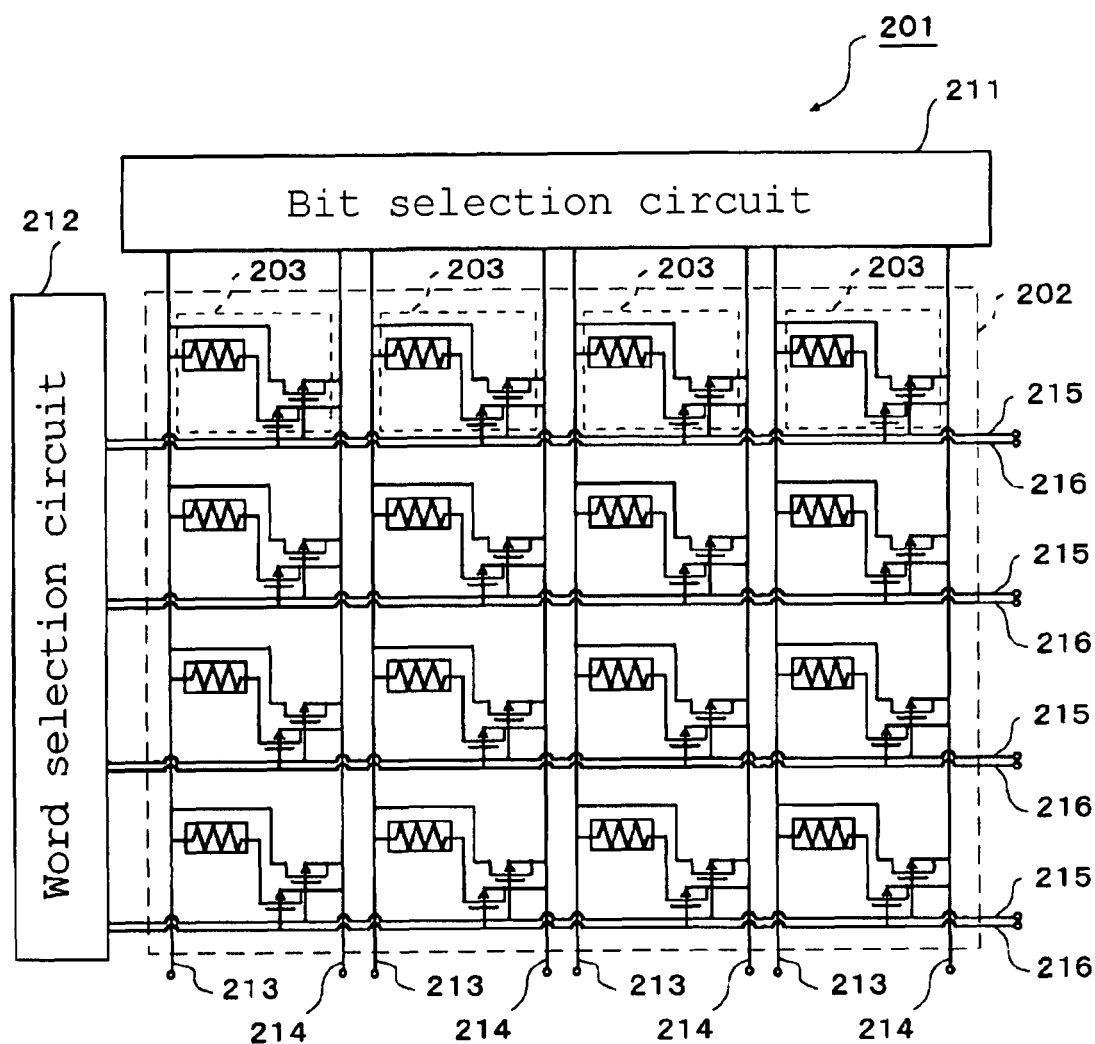
FIG. 11 is a conceptual drawing illustrating a general view of a magnetic storage device according to the third embodiment of the present invention.
Figure 12:
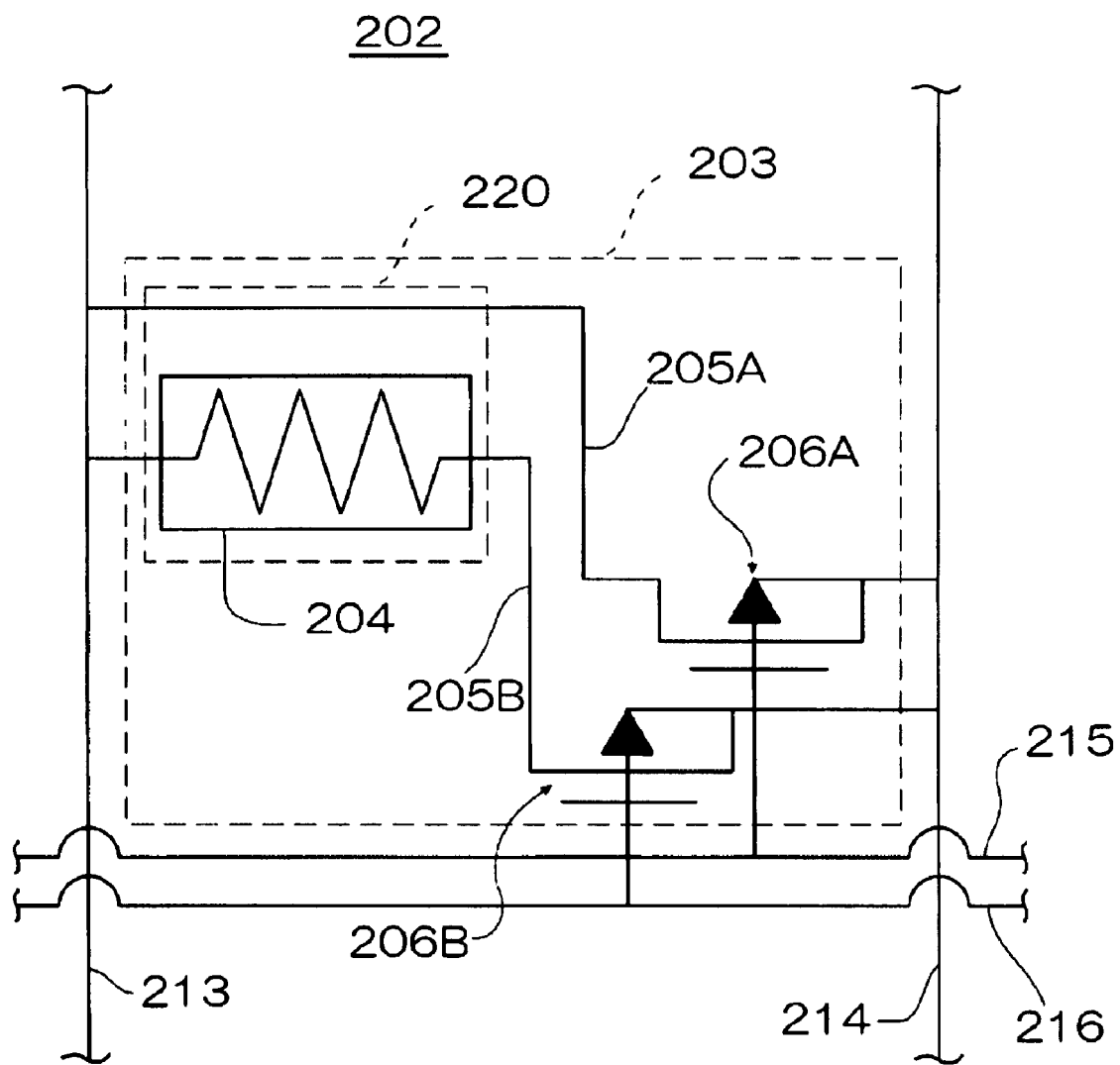
FIG. 12 is a conceptual drawing illustrating a memory cell of the magnetic storage device under magnification.

A magnetic storage device 201 according to the third embodiment of the present invention will now be described with reference to FIG. 11 and the like. FIG. 11 is a conceptual illustration of the general view of a magnetic storage device 201. This magnetic storage device 201 includes a memory unit 202, a bit selection circuit 211, a word selection circuit 212, bit lines 213 and 214, and word lines 215 and 216. In the memory unit 202, a plurality of memory cells 203 are disposed in a two-dimensional m×n formation (an array formation), where m and n are integers equal to or greater than 2. As illustrated under magnification in FIG. 12, each memory cell 203 includes a TMR element 204, a write line 205A, a read line 205B, a write transistor 206A, a read transistor 206B, and a soft magnetic yoke 220 constituting the soft magnetic body. Since the write line 205A and the read line 205B are disposed so as to be drawn in from the bit line 213, the write line 205A, the read line 205B, the soft magnetic yoke 220, and the anti-ferromagnetic layer pinning this soft magnetic yoke 220 (details are to be described later) are independently disposed for each memory cell 203.

In this magnetic storage device 201, by separately disposing the write line 205A and the read line 205B, noise factors such as sneak current can be reduced.

Both ends of the write line 205A are connected to the bit lines 213 and 214, respectively, and the write transistor 206A is disposed between the two ends. Therefore, by applying a voltage between the bit lines 213 and 214 and turning on the write transistor 206A, a current can flow through the write line 205A, thereby creating a magnetic field around the TMR element 204 disposed nearby. Moreover, both ends of the read line 205B are also connected to the bit lines 213 and 214, respectively, and the read transistor 206B and the TMR element 204 are disposed between the two ends. Therefore, by applying a voltage between the bit lines 213 and 214 and turning on the read transistor 206B, a current can flow through the read line 205B, thereby detecting the change in a value of resistance of the TMR element 204. Here, the write transistor 206A is connected to the word line 215, and the read transistor 206B is connected to the word line 216. Therefore, by utilizing voltages applied to these word lines 215 and 216, the continuity of each of the transistors 206A and 206B is individually switched. As a result, a current can be made to flow from the bit lines 213 and 214 to the word line 215 if necessary. The write line 205A disposed adjacent to the TMR element 204 extends in the direction of the arrayed surface (plane) of the memory cell 203 and is L-bent in this plane.

Figure 13:
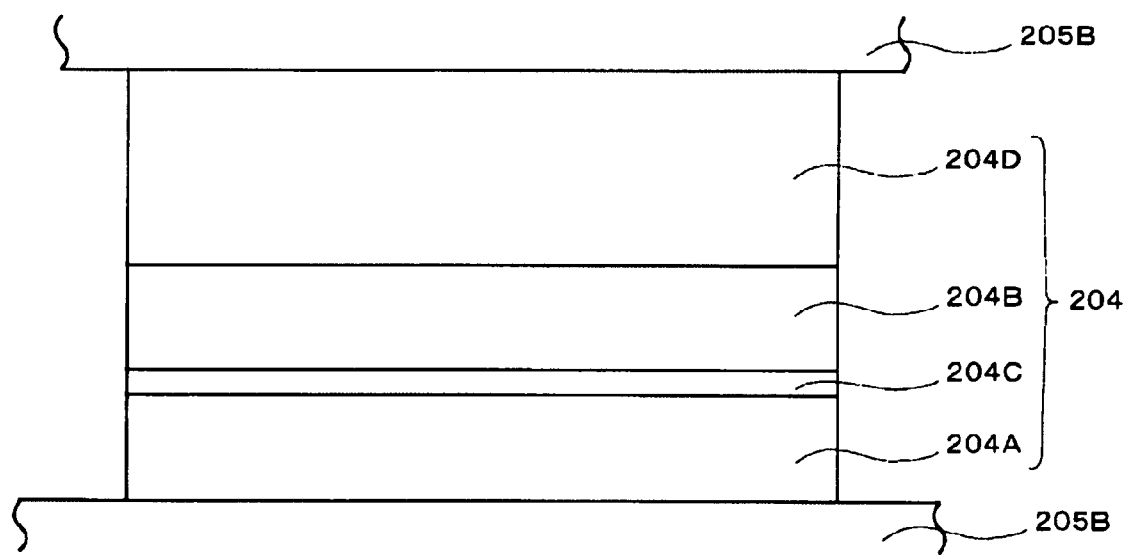
FIG. 13 is a side view illustrating under magnification the layered structure of a magneto-resistive element to be disposed in the magnetic storage device.

As illustrated under magnification in FIG. 13, the TMR element 204 includes a first magnetic layer (free layer/magnetic sensing layer) 204A whose direction of magnetization changes according to an external magnetic field, a second magnetic layer (pinned layer) 204B whose direction of magnetization is fixed, a nonmagnetic insulating layer (insulating layer) 204C interposed between the first magnetic layer 204A and the second magnetic layer 204B, and an anti-ferromagnetic layer 204D that fixes (or pins) the direction of magnetization of the second magnetic layer 204B. Moreover, the anti-ferromagnetic layer 204D of the TMR element 204 is electrically connected to one read line 205B. In addition to this, the first magnetic layer 204A of the TMR element 204 is electrically connected to the other read line 205B. Because of this structure, by allowing a read current to flow through the read line 205B, the change in a value of resistance of the TMR element 204 can be detected. In this instance, the easy axis of magnetization of the first magnetic layer 204A of the TMR element 204 is selected to be in the direction that perpendicularly intersects the longitudinal direction of the write line 205A, or, in other words, in the direction that perpendicularly intersects the direction of the write current.

Figure 14:
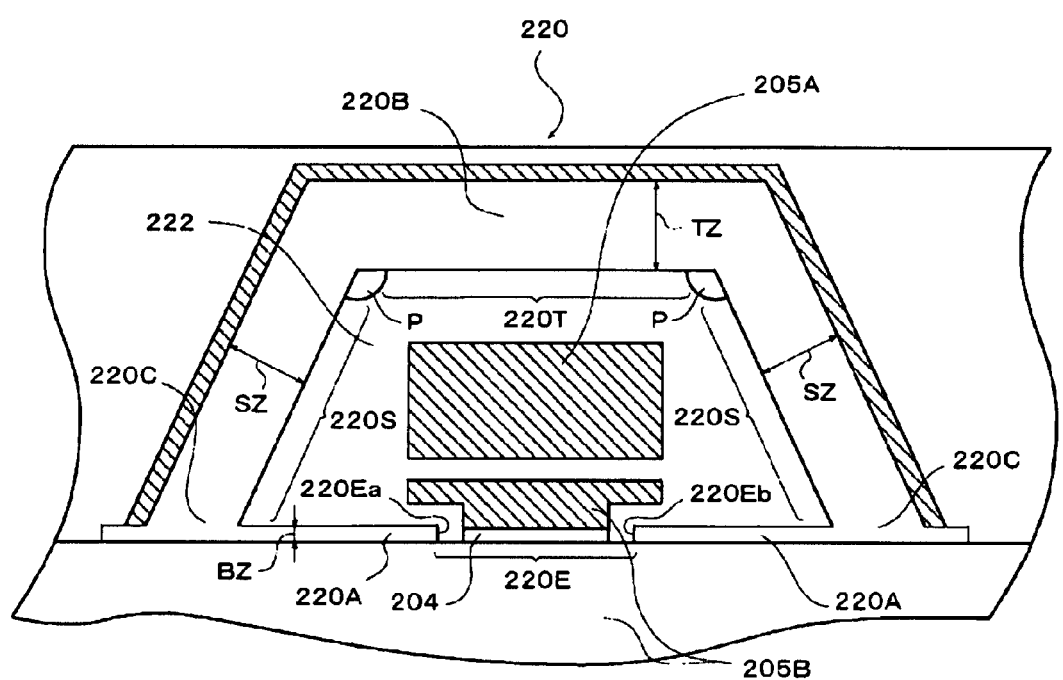
FIG. 14 is a cross-sectional view illustrating under magnification the structure of the soft magnetic yoke disposed in the magnetic storage device.

As shown in FIG. 14, the soft magnetic yoke 220 includes an element side yoke 220A disposed closely on the TMR element 204 side of the extending write line 205A, and a non-element side yoke 220B disposed closely on the side opposite to the TMR element 204 of the write line 205A. Furthermore, there is provided a pair of yoke connecting sections 220C and 220C at both ends of the element side yoke 220A as well as at both ends of the non-element side yoke 220B so as to connect the two in an annular configuration. Therefore, when viewed from the TMR element 204, the element side yoke 220A is close to the TMR element 204, and the non-element side yoke 220B is far away from the TMR element 204. Moreover, this soft magnetic yoke 220 partially covers the circumference of the write line 205A, making almost annular structure. The non-element side yoke 220B is made of a top region 220T positioned over the write line 205A, and inclined regions 220S positioned on both sides of the top region 220T, or equivalently, closely to the yoke connecting sections 220C.

The element-side yoke 220A has an opening 220E at the middle of the annular configuration, where the TMR element 204 is disposed. Therefore, when the soft magnetic yoke 220 is viewed in the direction of into the figure, there are open ends 220Ea and 220Eb along its circumference, having an almost C-shaped configuration. These open ends 220Ea and 220Eb form tip ends of the element-side yokes 220A and are disposed close to the lateral sides of the TMR element 204.

Furthermore, a yoke anti-ferromagnetic layer 226 is formed on the outer circumference side of the soft magnetic yoke 220. Therefore, the direction of magnetization of the soft magnetic yoke 220 is stabilized by the exchange coupling at the joint with the yoke anti-ferromagnetic layer 226. The pinning direction of the magnetization configuration of the soft magnetic yoke 220 is selected to be almost equal to the extending direction of the write line 205A, or equivalently the direction perpendicular to a magnetic field induced by the write line 205A.

The thickness TZ of the top region 220T of the non-element side yoke 220B will now be described. If the exchange coupling energy at the boundary surface between the non-element side yoke 220B and the yoke anti-ferromagnetic layer 226 is J (erg/cm²), the saturation magnetization of the non-element side yoke 220B is Ms (emu/cc), and the coercive force of the non-element side yoke 220B is Hc (Oe), then the thickness TZ (cm) of the non-element side yoke 220B is selected such that TZ<J/(Hc·Ms). In particular, in the case of the present embodiment, if an externally applied magnetic field necessary for the non-element side yoke 220B to reach 80% of the saturation magnetization Ms is $Hc_2$ (Oe), then the thickness TZ (cm) of the non-element side yoke 220B is chosen such that TZ<J/($Hc_2$·Ms).

For example, in the case where the non-element side yoke 220B is made of NiFe and the yoke anti-ferromagnetic layer 226 is made of IrMn, the saturation magnetization Ms of the non-element side yoke 220B of NiFe is 780 (emu/cc), the coercive force Hc thereof is 6 (Oe), and the exchange coupling energy J of NiFe/IrMn at the boundary between the non-element side yoke 220B and the yoke anti-ferromagnetic layer 226 is 0.061 (erg/cm²). Therefore, by putting these values into the equation TZ<J/(Hc·Ms), the thickness t of the non-element side yoke 220B becomes less than 130 nm.

Furthermore, it is preferable that magnetic force Hua (Oe) of a pinning magnetic field by the yoke anti-ferromagnetic layer 226 be greater than the externally applied magnetic field $Hc_2$ (Oe) at the non-element side yoke 220B. The reason for this is that, if the magnetic force of the pinning magnetic field Hua exceeds the externally applied magnetic field that is capable of inducing up to approximately 80% of the saturation magnetization Ms of the non-element side yoke 220B, then the magnetization configuration of the non-element side yoke 220B can be made to be a single domain more securely along the direction of the pinning magnetic field.

For example, an externally applied magnetic field necessary for the non-element side yoke 220B made of NiFe to reach 80% of the saturation magnetization Ms is 8 (Oe). Hence, by putting this value into the equation TZ<J/($Hc_2$·Ms), it turns out that the thickness t of the non-element side yoke 220B needs to be selected to be less than 93 nm.

Furthermore, the thickness TZ of the non-element side yoke 220B is selected to be greater than the thickness BZ of the element side yoke 220A. For example, the thickness TZ is selected to be 50 nm or more. Furthermore, the thickness BZ of the element side yoke 220A that is thinner than the non-element side yoke 220B is selected to be in the range from 10 nm to 30 nm. Moreover, the thickness SZ of the inclined region 220S is selected to be in the range from 20 nm to 100 nm on the average. The maximum height of the non-element side yoke 220B relative to the level of the TMR element 204 is, for example, selected to be 300 nm or less.

When forming the non-element side yoke 220B of the soft magnetic yoke 220, a pinning magnetic field is applied in a non-annealing environment. The direction Y of this pinning magnetic field is selected to be parallel to the extending direction of the write line 205A, and the strength of the pinning magnetic field is selected to be greater than the coercive force Hc of the non-element side yoke 220B. More preferably, the strength of the pinning magnetic field is selected to be greater than the applied magnetic field $Hc_2$ necessary for the non-element side yoke 220B to reach 80% of the saturation magnetization Ms. Furthermore, in the non-annealing environment with the pinning magnetic field being applied, the non-element side yoke 220B (the inclined region 220S and the top region 220T) and the yoke anti-ferromagnetic layer 226 are successively deposited in a series of processes. Consequently, the yoke anti-ferromagnetic layer 226 can be deposited while the magnetization configuration of the non-element side yoke 220B is held oriented along the direction Y of the pinning magnetic field. Note that it is preferable that ferromagnetic materials constituting the soft magnetic yoke 220 be, for example, alloys containing at least one of Ni, Fe, and Co. In the present embodiment, NiFe is used.

Next, with reference to FIGS. 15, 16, and 17, a write cycle on the TMR element 204 of the magnetic storage device 201 of the present embodiment will be described.

Figure 15:
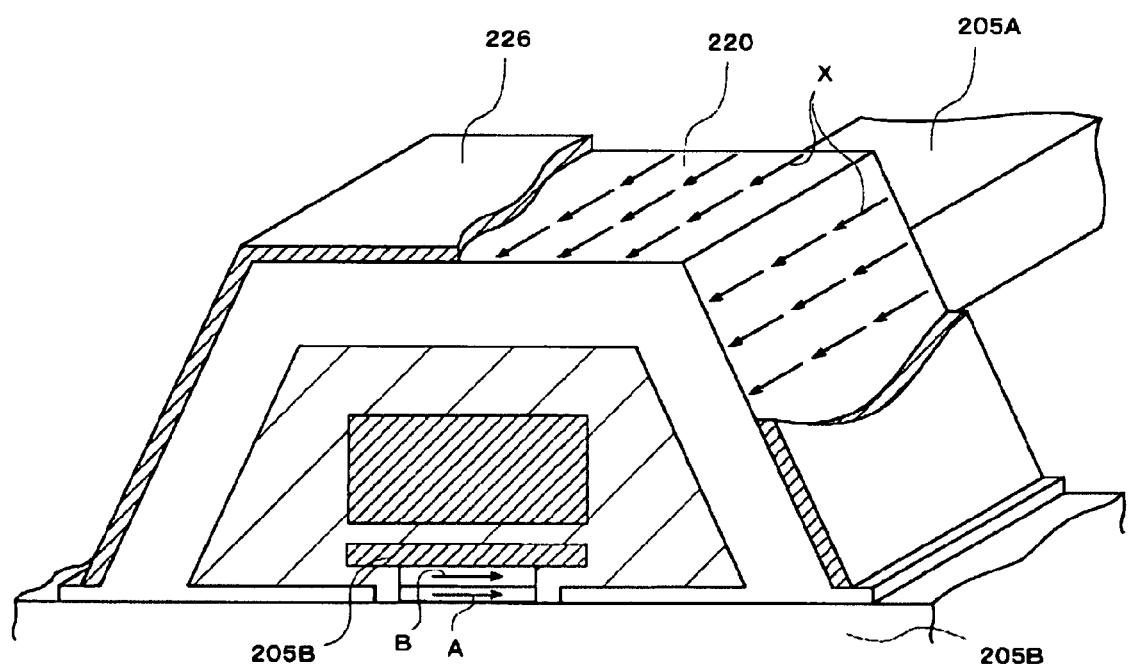
FIG. 15 is a perspective view with cross-section schematically illustrating the magnetization configuration of the soft magnetic yoke to be disposed in the magnetic storage device.

As shown in FIG. 15, when there is no current flowing through the write line 205A, no magnetic field is created by this write line 205A. Therefore, the magnetization configuration X of the soft magnetic yoke 220 is under the influence of the pinning effect from the yoke anti-ferromagnetic layer 226, and its direction is almost in agreement with the extending direction of the write line 205A. Therefore, the soft magnetic yoke 220 is in the state of single domain with the magnetization direction of the entire portion being unified into a single direction. The magnetization direction B of the second magnetic layer 204B and the magnetization direction A of the first magnetic layer 204A within the TMR element 204 are the same. In this instance, it is defined that the binary data of 0 has been recorded when the magnetic directions A and B are the same.

Figure 16:
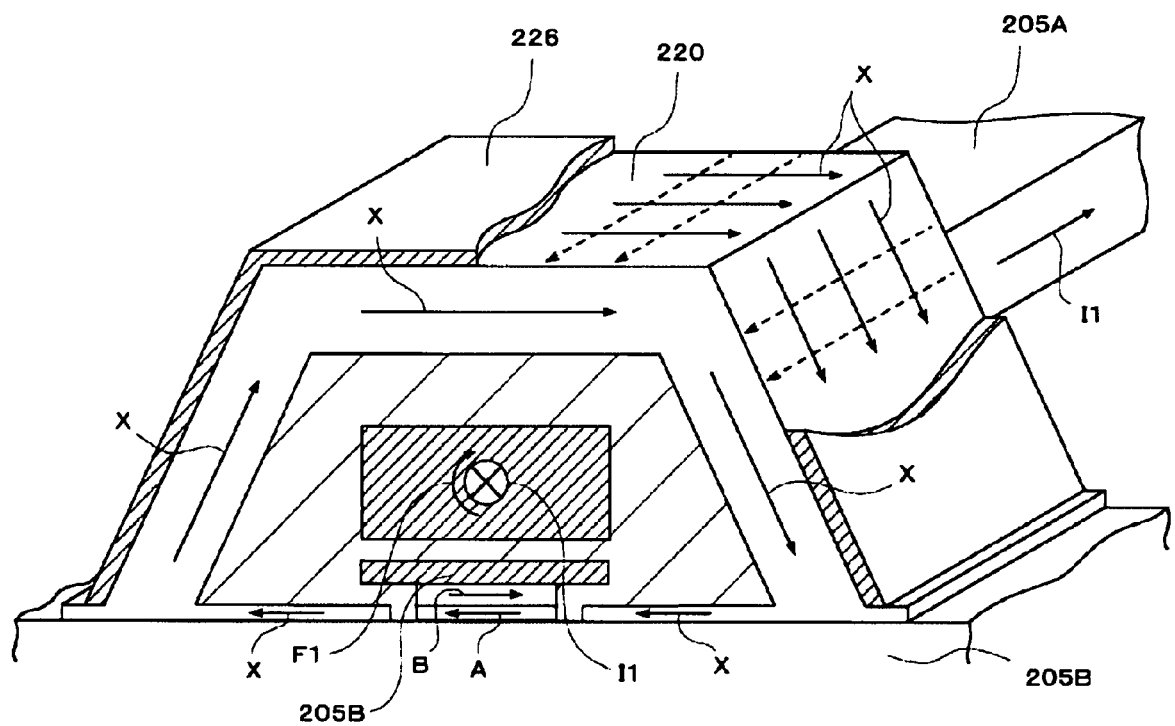
FIG. 16 is a perspective view with cross-section schematically illustrating the magnetization configuration of the soft magnetic yoke to be disposed in the magnetic storage device.

As shown in FIG. 16, if a write current flows through the write line 205A, a circumferential magnetic field F1 is created around the write line 205A. The magnetic field F1 goes around and makes a closed loop within the soft magnetic yoke 220 that is provided around the write line 205A. Then, the magnetization configuration X of the soft magnetic yoke 220 changes so that its magnetization direction is smoothly driven to turn 90° and approaches to the direction of the magnetic field F1 so as to be induced by this magnetic field F1 while resisting the influence of the pinning effect (see the dotted arrows in the figure) of the yoke anti-ferromagnetic layer 226.

As a result, the magnetic field F1 created by the write line 205A and the magnetization configuration X produced in the soft magnetic yoke 220 combine to yield a strong magnetic field, which acts on the first magnetic layer 204A in the TMR element 204, inverting its magnetization direction A. Then, if the current I1 in the write line 205A is turned off while holding other conditions unchanged, the magnetization configuration X of the soft magnetic yoke 220 smoothly returns to its original state as shown in FIG. 15 because of the pinning effect of the yoke anti-ferromagnetic layer 226. In this case, however, the magnetization direction A of the TMR element 204 is maintained as being inverted as in FIG. 16. Since the magnetization directions A and B are maintained as being in the opposite direction, the binary data of 1 has been recorded here.

Figure 17:
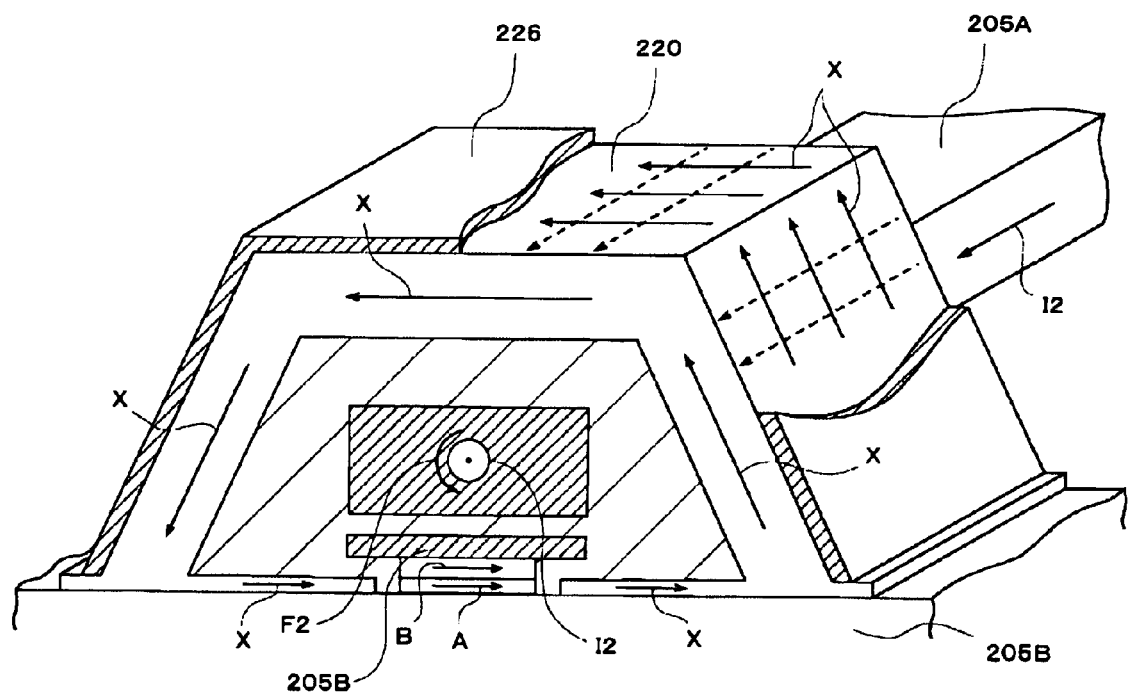
FIG. 17 is a perspective view with cross-section schematically illustrating the magnetization configuration of the soft magnetic yoke to be disposed in the magnetic storage device.

Next, as shown in FIG. 17, when a write current I2 that is in the opposite direction to I1 flows through the write line 205A, a circumferential magnetic field F2 is created around the write line 205A. The magnetic field F2 forms a closed loop that goes around within the soft magnetic yoke 220 that is provided around the write line 205A. The magnetization configuration X of the soft magnetic yoke 220 changes so that its magnetization direction is smoothly driven to turn 90° and approaches to the direction of the magnetic field F2 so as to be induced by this magnetic field F2 while resisting the influence of the pinning effect (see the dotted arrows in the figure) of the yoke anti-ferromagnetic layer 226.

As a result, the magnetic field F2 produced by the write line 205A and the magnetization configuration X produced in the soft magnetic yoke 220 combine to yield a strong magnetic field, which acts on the first magnetic layer 204A in the TMR element 204, inverting and making its magnetization direction A to be the same once again as the magnetization direction B of the second magnetic layer 204B. Then if the current I2 in the write line 205A is turned off while holding other conditions unchanged, then the magnetization configuration X of the soft magnetic yoke 220 returns to its original state as shown in FIG. 15 because of the pinning effect of the yoke anti-ferromagnetic layer 226. Here, since, in the TMR element 204, the magnetization directions A and B are the same, the binary data of 0 has been recorded again.

When reading the binary data stored in the TMR element 204, a read current is allowed to flow through the read line 205B, and a change in the value of the current or in the potential difference across the read line 205B is detected. This reveals the value of the resistance, and which binary data is stored, or namely, whether the magnetization directions A and B of the first magnetic layer 204A and the second magnetic layer 204B, respectively, are parallel or antiparallel, can be determined. For example, when the magnetization direction A of the first magnetic layer 204A is the same as the magnetization direction B of the second magnetic layer 204B, the value of the resistance between the first magnetic layer 204A and the second magnetic layer 204B becomes relatively small due to the tunneling magneto-resistance (TMR) in the nonmagnetic insulating layer 204C. On the other hand, when the magnetization directions A and B are in the opposite direction, the value of the resistance between the first magnetic layer 204A and the second magnetic layer 204B becomes relatively large due to the tunneling magneto-resistance.

According to the magnetic storage device 201 described above, since the thickness TZ of the soft magnetic yoke 220 is selected to be in a prescribed range, the magnetization configuration X of the soft magnetic yoke 220 is always of a single domain, and a smooth change of a magnetic field can be realized, compared to a case where a plurality of domains are formed spontaneously and irregularly. Therefore, Barkhausen noise during the change of magnetization configuration X can be reduced. Furthermore, in the case where a plurality of memory cells 203 are disposed in an arrayed formation as shown in FIG. 11, magnetic characteristics obtained by the write line 205A and the soft magnetic yoke 220 can be homogenized, thereby facilitating the write cycle control.

Furthermore, in the case of the independent structure where the write line 205A is drawn from the bit line 213 for each memory cell 203, and the soft magnetic yoke 220 is formed for each write line 205A, magnetization characteristics among a plurality of soft magnetic yokes 220 generally differ, and variations of magnetization characteristics of the memory cells 203 result easily. However, if the soft magnetic yoke 220 is made into a single domain as in the magnetic storage device 201, the variations of magnetization characteristics can be reduced, and the writing speed can be homogenized among a plurality of memory cells 203.

Furthermore, when the soft magnetic yoke 220 is provided to the write line 205A, since the annular direction of the soft magnetic yoke 220 means the longitudinal direction, a plurality of domains will be formed mainly along the longitudinal direction, and annularly unbalanced magnetization configuration results unless pinning is carried out. In other words, during the write cycle of binary data, situations where a writing speed in one memory cell is different in another memory cell or where a value of voltage/current required in one memory cell is different in another memory cell may arise. Consequently, according to the third embodiment of the present invention, the magnetization configuration X of the soft magnetic yoke 220 is forced to orient in the direction of the write line 205A. Therefore, the neutral magnetization configuration X is always maintained, and a write cycle does not depend upon the direction of the current through the write line 205A. In addition to this, during the write cycle for either 0 or 1, values of current/voltage and magnetic field generation speeds (rate of rise/writing speed) can be homogenized.

Furthermore, according to this magnetic storage device 201, since the soft magnetic yoke 220 is formed first and, then, the yoke anti-ferromagnetic layer 226 is deposited thereon during its production, the soft magnetic yoke 220 can be pinned easily. Moreover, when the magnetic storage device 201 has a complicated structure where the write line 205A bends in front and behind of the soft magnetic yoke 220, a magnetic field that can cause noise may be easily created from that line. Although the soft magnetic yoke 220 can be easily affected by these noise fields, by pinning the soft magnetic yoke 220 by the yoke anti-ferromagnetic layer 226, a bias in the neutral direction can be provided to its magnetization configuration X, thereby reducing the influence of noises.

Since, in this magnetic storage device 201, the write lines 205A and the read lines 205B are mutually independent, a current can be selected to flow only through the write line 205A during the write cycle. Similarly, a current can also be selected to flow only through the read line 205B during the read cycle. As a result, it is possible that a sneak current or the like be avoided without arranging any diodes or the like, and both write and read cycles can further be stabilized.

Furthermore, in the magnetic storage device 201, the element-side yoke 220A is severed and separated in the middle, and the TMR element 204 is disposed therewith a certain gap being provided between the severed end of the element-side yoke 220A and the end face of the TMR element 204. As a result, it is possible that a magnetic field due to the soft magnetic yoke 220 be applied to the end face of the TMR element 204, thereby improving the responsiveness during the write cycle. By the way, "the severed and separated element-side yoke" in the present embodiment refers to the shape of the finished soft magnetic yoke 220 and is not limited to the case where an unsevered element-side yoke 220A is formed first and, then, severed and separated. For example, a pair of element-side yoke 220A may be provided separately such that they appear to be severed and separated with the TMR element 204 being provided therebetween.

Figure 18:
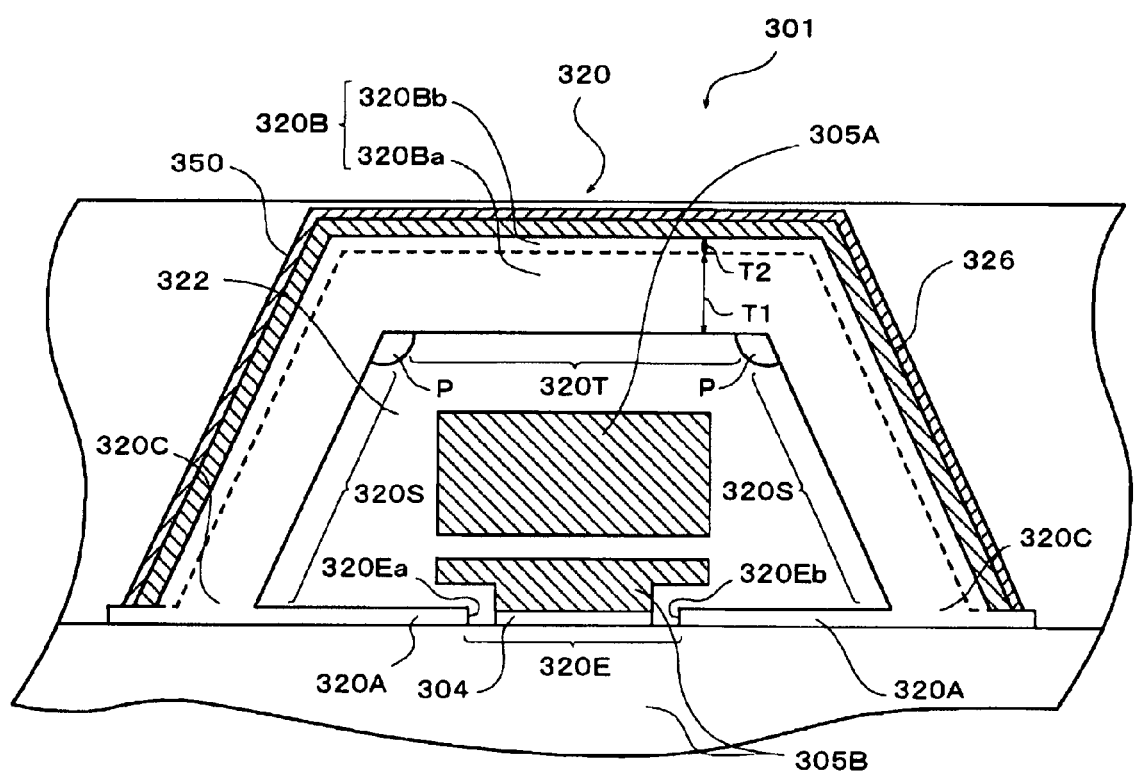
FIG. 18 is across-sectional view illustrating under magnification the soft magnetic yoke of a magnetic storage device according to the fourth embodiment of the present invention.

Next, a magnetic storage device 301 according to the fourth embodiment of the present invention will be described with reference to FIG. 18. In the following description, the same or similar components as those appeared in the magnetic storage device 201 of the third embodiment will be designated with reference numerals whose last two digits are the same as in the third embodiment and their descriptions will be omitted.

In this magnetic storage device 301, the non-element side yoke 320B made of a soft magnetic body has double layer structure including a first soft magnetic layer 320Ba and a second soft magnetic layer 320Bb. In addition to this, materials for the first soft magnetic layer 320Ba and the second soft magnetic layer 320Bb are different. Therefore, the yoke anti-ferromagnetic layer 326 is in contact with the second soft magnetic layer 320Bb. The magnetic storage device 301 is further provided with an oxidation prevention cap layer 350 on the outer circumference side of the yoke anti-ferromagnetic layer 326. This oxidation prevention cap layer 350 is preferably made of Ta or the like, which can prevent the oxidation of the yoke anti-ferromagnetic layer 326.

In this magnetic storage device 301, consider the case in which the thickness of the first soft magnetic layer 329Ba is T1, the exchange coupling energy between the first soft magnetic layer 320Ba and the yoke anti-ferromagnetic layer 326 is J1, the saturation magnetization of the first soft magnetic layer 320Ba is Ms1, the thickness of the second soft magnetic layer 320Bb is T2, the exchange coupling energy between the second soft magnetic layer 320Bb and the yoke anti-ferromagnetic layer 326 is J2, and the saturation magnetization of the second soft magnetic layer 320Bb is Ms2. Then, a pinning magnetic field Hua obtained by the yoke anti-ferromagnetic layer 326 can be expressed as Hua=J1/(Ms1·T1)+J2/(Ms2·T2). For example, when the first soft magnetic layer 320Ba is made of NiFe, the saturation magnetization Ms1 of NiFe is 780 (emu/cc) and the exchange coupling energy J1 of NiFe/IrMn is 0.061 (erg/cm$^2$). Furthermore, when the second soft magnetic layer 320Bb is made of CoFe, the saturation magnetization Ms2 of CoFe is 1500 (emu/cc), and the exchange coupling energy J2 of CoFe/IrMn is 0.192 (erg/cm$^2$). Since CoFe has the exchange coupling energy J2 that is approximately three times that of NiFe, it acts in the direction of strengthening the pinning magnetic field Hua. Therefore, by providing the second soft magnetic layer 320Bb made of CoFe as a thin film of, for example, approximately 2 nm, on the outer circumference side of the first soft magnetic layer 320Ba made of NiFe, the pinning magnetic field Hua can be strengthened. The strengthened pinning magnetic field Hua allows in turn the thickness of the non-element side yoke 320 (T1+T2) to be large, thereby enhancing the shielding effect and reducing a leak of a magnetic field of the write line 305A.

Example 1

Figure 19:
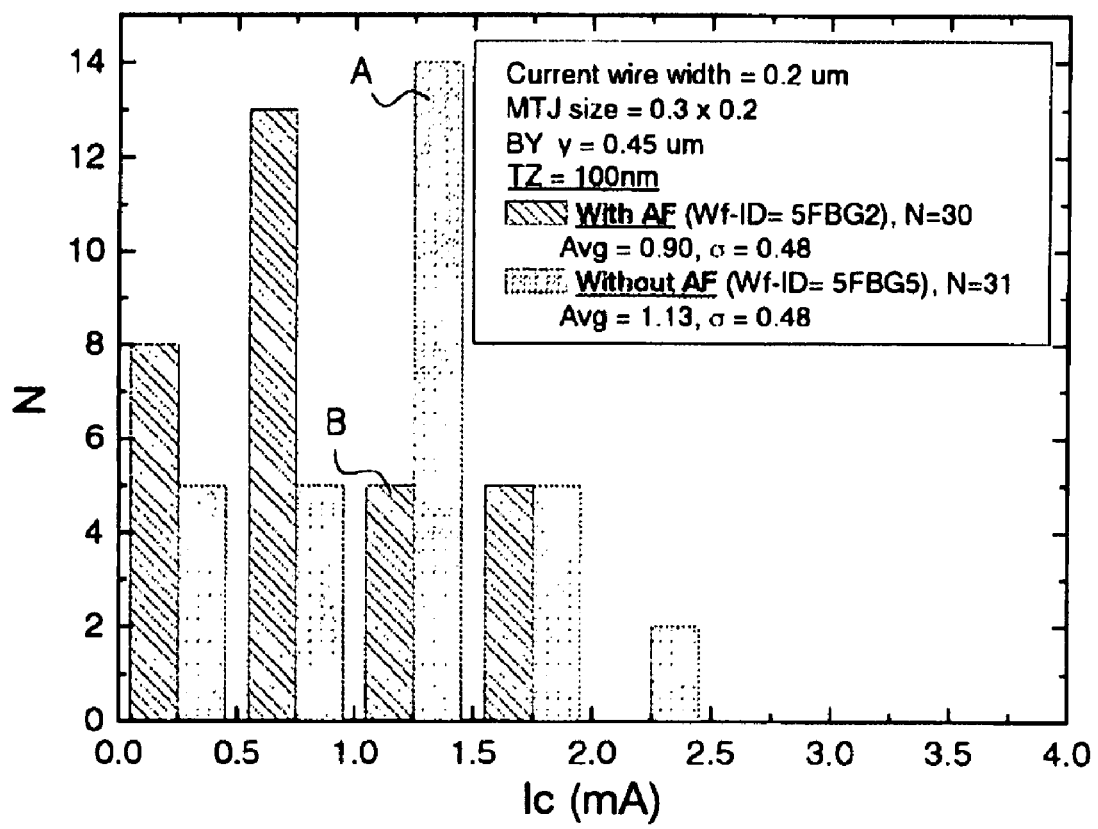
FIG. 19 is a bar graph statistically illustrating the variations of the write current in the magnetic storage device according to Example 1 and a comparative example.

A plurality of memory cells 203 of the magnetic storage device 201 with the yoke structure according to the third embodiment of the present invention were prepared, and the write current needed at each memory cell was statistically analyzed. In this magnetic storage device 201, the soft magnetic yoke 220 was made of NiFe, the yoke anti-ferromagnetic layer 226 was made of IrMn, and the thickness TZ of the non-element side yoke 220B was selected to be 100 nm, so that TZ<J/(Hc·Ms)=130 nm was satisfied. As a comparative example, another magnetic storage device 201 with no yoke ferromagnetic layer 226 was prepared, and write currents were analyzed in a similar manner. The results are shown in FIG. 19. The average value of the write current calculated from bars designated by B in the graph, which serves as a comparative example, was 1.13 (mA). However, the average value of the write current calculated from bars designated by A in the graph was 0.90 (mA), and it turned out that the write current could be reduced. In other words, by pinning the soft magnetic yoke 220, the magnetization characteristics of the memory cells 203 are homogenized, and the average current can be reduced.

Example 2

Figure 20:
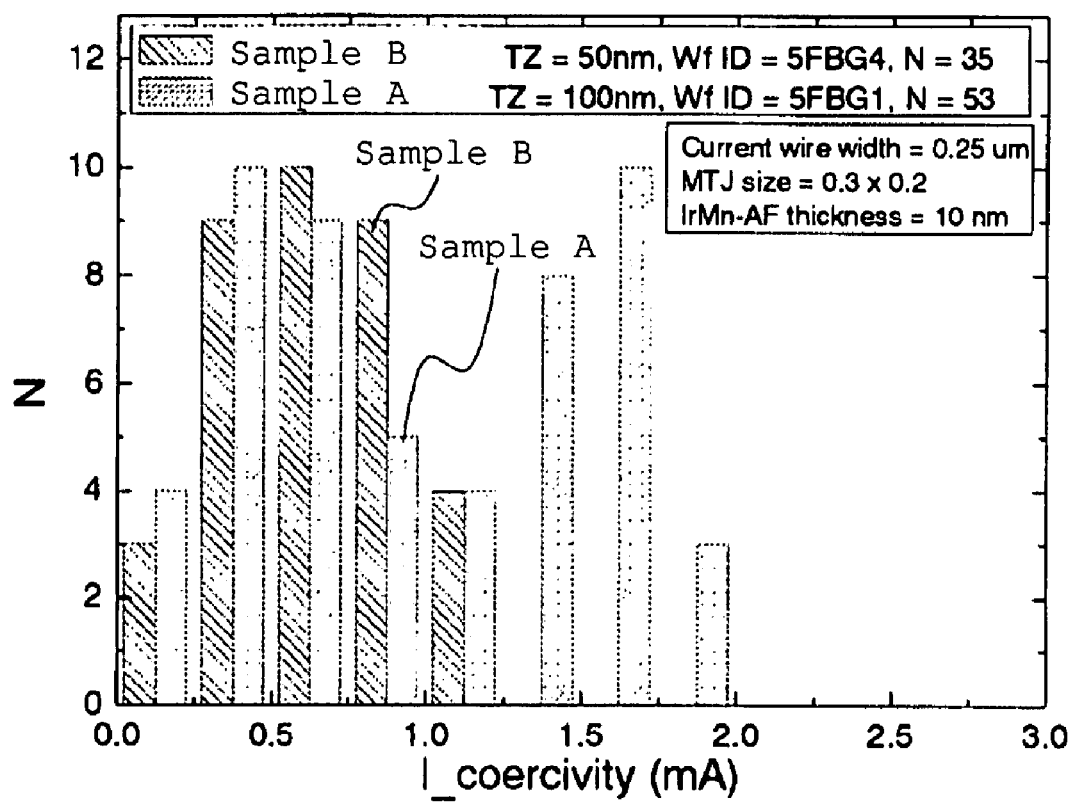
FIG. 20 is a bar graph statistically illustrating the variations of the write current in the magnetic storage device according to Example 2.
Figure 21:
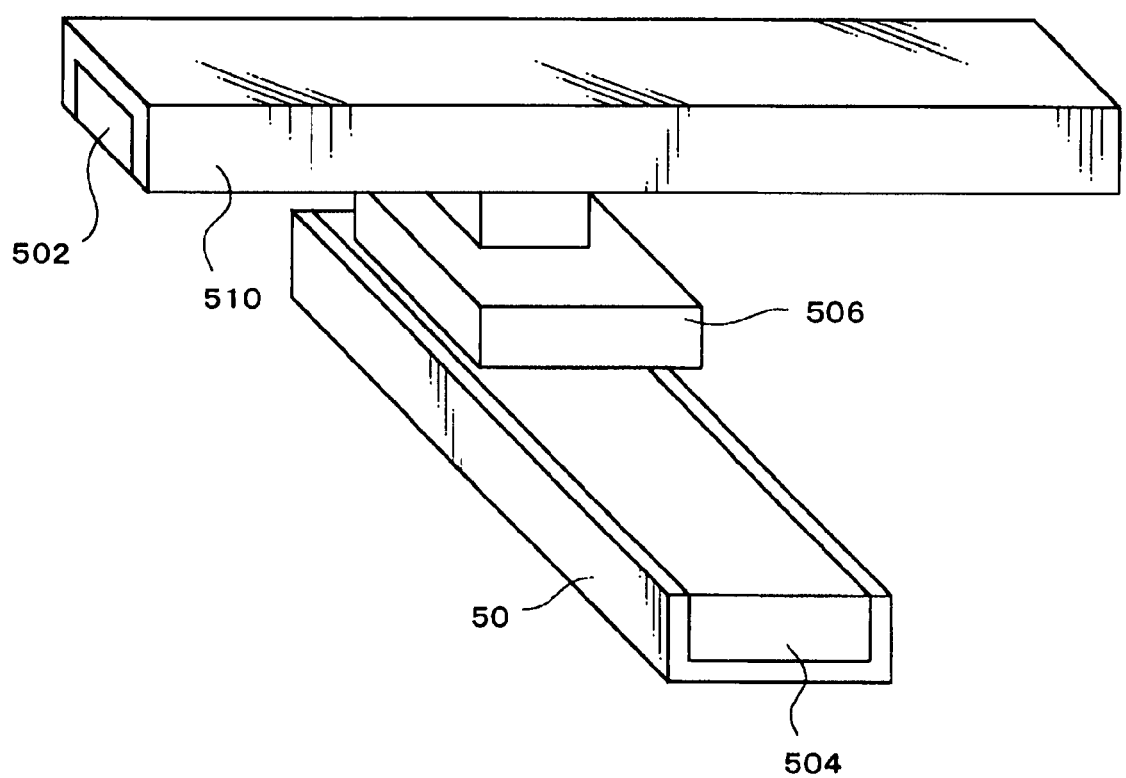
FIG. 21 is a perspective view illustrating the structure of a conventional magnetic storage device.

Next, a plurality of memory cells 203 of the magnetic storage device 201 according to the third embodiment of the present invention were prepared, and the write current needed at each memory cell was statistically analyzed. In Example 2, a plurality of magnetic storage devices 201 were prepared, where those having the thickness TZ of the non-element side yoke 220B of 100 nm were designated as sample A, and those having TZ of 50 nm as sample B. Since the soft magnetic yoke 220 was made of NiFe, and the yoke anti-ferromagnetic layer 226 was made of IrMn, sample A of the magnetic storage device 201 in which the thickness TZ of the non-element side yoke 220B was selected to be 100 nm satisfied the equation TZ<J/(Hc·Ms)=130 nm. On the other hand, sample B of the magnetic storage device 201 in which the thickness TZ of the non-element side yoke 220B was selected to be 50 nm also satisfied TZ<J/(Hc$_2$·Ms)=93 nm. The results are shown in FIG. 20. With sample A, the mean value of the write current was 0.98 (mA), and the variations (variance) were 0.54 (mA). However, with sample B, the mean value of the write current was 0.54 (mA), and the variations (variance) were 0.27 (mA). Consequently, it was revealed that sample B was more capable of reducing the write current further and considerably reducing the variation of the write currents than sample A. In other words, it was revealed that, by selecting the magnetic force of the pinning magnetic field due to the yoke anti-ferromagnetic layer 225 to be greater than the externally applied magnetic field Hc$_2$ necessary for the non-element side yoke 220B to reach 80% of the saturation magnetization Ms, the soft magnetic yoke 220 could be pinned more securely, and the magnetization characteristics of each memory cell 203 could be homogenized.

The magnetic storage device according to the present invention is not limited to those described in the above embodiments, but numerous variations thereof may be possible. For example, instead of using a TMR element as a tunneling magneto-resistive device as in the above-mentioned embodiments, a GMR element that utilizes giant magneto-resistance (GMR) may be used. GMR is a phenomenon that, depending on an angle formed with magnetization directions of two ferromagnetic layers with a nonmagnetic layer interposed therebetween, a value of resistance of the ferromagnetic layers in the direction perpendicular to that of lamination of layers changes. In other words, in a GMR element, the value of resistance of the ferromagnetic layers becomes minimum when the magnetization directions of the two ferromagnetic layers are parallel and maximum when the magnetization directions of the two ferromagnetic layers are anti-parallel. By the way, TMR elements or GMR elements come in either a pseudo spin valve type in which a write/read cycle utilizes a difference in coercive force of the two ferromagnetic layers or a spin valve type in which the magnetization direction of one of the ferromagnetic layers is fixed by exchange coupling with the anti-ferromagnetic layer. Furthermore, data readout in a GMR element is accomplished by detecting the change in the value of resistance of the ferromagnetic layers in the direction perpendicular to that of the lamination of the layers. Furthermore, data writing in a GMR element is accomplished by inverting the magnetization direction of one of the ferromagnetic layers by a magnetic field created by a write current.

A magnetic storage device of the present invention is not limited to those described in the above-mention embodiments and may be practiced or embodied in still other ways without departing from the spirit thereof.

The present invention can be widely applied in a field where a variety of information is recorded and maintained in a tunneling magneto-resistive element.

The entire disclosure of Japanese Patent Application No. 2006-158142 filed on Jun. 7, 2006 including specification, claims, drawings, and summary are incorporated herein by reference in its entirety.

What is claimed is:
1. A magnetic storage device comprising;
a line;
a soft magnetic body that is formed so as to cover the line either totally or partially;
an anti-ferromagnetic layer that is formed on an outer surface of the soft magnetic body; and
a magneto-resistive element that is disposed in the vicinity of the line, wherein
an equation t<J/(Hc·Ms) is satisfied, where J (erg/cm$^2$) is an exchange coupling energy at a boundary between the soft magnetic body and the anti-ferromagnetic layer, Ms

(emu/cc) is a saturation magnetization of the soft magnetic body, Hc (Oe) is a coercive force of the soft magnetic body, and t (cm) is a thickness of the soft magnetic body, wherein the thickness t of the soft magnetic body satisfies an equation $t<J/(Hc_2 \cdot Ms)$ where $Hc_2$ (Oe) is an applied magnetic field necessary for the soft magnetic body to reach 80% of the saturation magnetization Ms.

2. The magnetic storage device according to claim 1, wherein a direction in which the line extends is almost perpendicular to a direction of easy axis of magnetization of the magneto-resistive element.

3. The magnetic storage device according to claim 1, comprising an oxidation prevention cap layer that is provided on an outer circumference side of the anti-ferromagnetic layer.

4. The magnetic storage device according to claim 2, wherein
a direction in which the line extends is almost perpendicular to a direction of easy axis of magnetization of the magneto-resistive element, and
further comprising an oxidation prevention cap layer that is provided on an outer circumference side of the anti-ferromagnetic layer.

5. The magnetic storage device according to claim 1, wherein
the soft magnetic body has a multi-layer structure which includes a first soft magnetic layer and a second soft magnetic layer, where the first and second layers are made of different materials.

6. The magnetic storage device according to claim 1, wherein
a direction in which the line extends is almost perpendicular to a direction of easy axis of magnetization of the magneto-resistive element; and
the soft magnetic body has a multi-layer structure which includes a first soft magnetic layer and a second soft magnetic layer, where the first and second layers are made of different materials.

7. The magnetic storage device according to claim 1, wherein
a direction in which the line extends is almost perpendicular to a direction of easy axis of magnetization of the magneto-resistive element; and
the soft magnetic body has a multi-layer structure which includes a first soft magnetic layer and a second soft magnetic layer, where the first and second layers are made of different materials, and
further comprising an oxidation prevention cap layer that is provided on an outer circumference side of the anti-ferromagnetic layer.

8. The magnetic storage device according to claim 1, wherein
the soft magnetic body includes an element side yoke that is disposed on the magneto-resistive element side of the line and a non-element side yoke that is disposed on the side of the line opposite to the magneto-resistive element, and is configured in an almost annular structure.

9. The magnetic storage device according to claim 1, wherein
a direction in which the line extends is almost perpendicular to a direction of easy axis of magnetization of the magneto-resistive element; and
the soft magnetic body includes an element side yoke that is disposed on the magneto-resistive element side of the line and a non-element side yoke that is disposed on the side of the line opposite to the magneto-resistive element, and is configured in an almost annular structure.

10. The magnetic storage device according to claim 1, wherein
a direction in which the line extends is almost perpendicular to a direction of easy axis of magnetization of the magneto-resistive element; and
the soft magnetic body includes an element side yoke that is disposed on the magneto-resistive element side of the line and a non-element side yoke that is disposed on the side of the line opposite to the magneto-resistive element, and is configured in an almost annular structure, and
further comprising an oxidation prevention cap layer that is provided on an outer circumference side of the anti-ferromagnetic layer.

11. The magnetic storage device according to claim 1, wherein
a direction in which the line extends is almost perpendicular to a direction of easy axis of magnetization of the magneto-resistive element;
the soft magnetic body has a multi-layer structure which includes a first soft magnetic layer and a second soft magnetic layer, where the first and second layers are made of different materials; and
the soft magnetic body includes an element side yoke that is disposed on the magneto-resistive element side of the line and a non-element side yoke that is disposed on the side of the line opposite to the magneto-resistive element, and is configured in an almost annular structure, and
further comprising an oxidation prevention cap layer that is provided on an outer circumference side of the anti-ferromagnetic layer.

12. A magnetic storage device comprising:
a line;
a soft magnetic body that is formed so as to cover the line either totally or partially;
an anti-ferromagnetic layer that is formed on an outer surface of the soft magnetic body; and
a magneto-resistive element that is disposed in the vicinity of the line, wherein
an equation $t<J/(Hc \cdot Ms)$ is satisfied, where J (erg/cm$^2$) is an exchange coupling energy at a boundary between the soft magnetic body and the anti-ferromagnetic layer, Ms (emu/cc) is a saturation magnetization of the soft magnetic body, Hc (Oe) is a coercive force of the soft magnetic body, and t (cm) is a thickness of the soft magnetic body, further comprising an oxidation prevention cap layer that is provided on an outer circumference side of the anti-ferromagnetic layer.

13. A magnetic storage device comprising:
a line;
a soft magnetic body that is formed so as to cover the line either totally or partially;
an anti-ferromagnetic layer that is formed on an outer surface of the soft magnetic body; and
a magneto-resistive element that is disposed in the vicinity of the line, wherein
an equation $t<J/(Hc \cdot Ms)$ is satisfied, where J (erg/cm$^2$) is an exchange coupling energy at a boundary between the soft magnetic body and the anti-ferromagnetic layer, Ms (emu/cc) is a saturation magnetization of the soft magnetic body, Hc (Oe) is a coercive force of the soft magnetic body, and t (cm) is a thickness of the soft magnetic body,
wherein the soft magnetic body has a multi-layer structure which includes a first soft magnetic layer and a second soft magnetic layer, where the first and second layers are made of different materials.

14. A magnetic storage device comprising:

a line;

a soft magnetic body that is formed so as to cover the line either totally or partially;

an anti-ferromagnetic layer that is formed on an outer surface of the soft magnetic body; and a magneto-resistive element that is disposed in the vicinity of the line, wherein an equation $t<J/(Hc \cdot Ms)$ is satisfied, where J (erg/cm$^2$) is an exchange coupling energy at a boundary between the soft magnetic body and the anti-ferromagnetic layer, Ms (emu/cc) is a saturation magnetization of the soft magnetic body, Hc (Oe) is a coercive force of the soft magnetic body, and t (cm) is a thickness of the soft magnetic body, wherein the soft magnetic body includes an element side yoke that is disposed on the magneto-resistive element side of the line and a non-element side yoke that is disposed on the side of the line opposite to the magneto-resistive element, and is configured in an almost annular structure.

* * * * *